US010802096B2

(12) United States Patent
Liu et al.

(10) Patent No.: US 10,802,096 B2
(45) Date of Patent: Oct. 13, 2020

(54) METHODS AND SYSTEMS FOR MAGNETIC RESONANCE IMAGING

(71) Applicant: UIH AMERICA, INC., Houston, TX (US)

(72) Inventors: Hui Liu, Houston, TX (US); Yu Ding, Houston, TX (US)

(73) Assignee: UIH AMERICA, INC., Houston, TX (US)

( * ) Notice: Subject to any disclaimer, the term of this patent is extended or adjusted under 35 U.S.C. 154(b) by 241 days.

(21) Appl. No.: 15/854,731

(22) Filed: Dec. 26, 2017

(65) Prior Publication Data
US 2019/0195975 A1 Jun. 27, 2019

(51) Int. Cl.
*G01R 33/48* (2006.01)
*G01R 33/58* (2006.01)
*G01R 33/561* (2006.01)

(52) U.S. Cl.
CPC ....... *G01R 33/4818* (2013.01); *G01R 33/561* (2013.01); *G01R 33/5611* (2013.01); *G01R 33/583* (2013.01)

(58) Field of Classification Search
CPC ............. G01R 33/4818; G01R 33/583; G01R 33/561; G01R 33/5611; G01R 33/48; G01R 33/5602
USPC ....................................................... 324/309
See application file for complete search history.

(56) References Cited

U.S. PATENT DOCUMENTS

| 4,480,228 A * | 10/1984 | Bottomley ........... G01R 33/485 324/307 |
| 6,198,283 B1 * | 3/2001 | Foo ...................... G01R 33/561 324/307 |
| 6,208,139 B1 * | 3/2001 | Foo ...................... G01R 33/561 324/307 |
| 8,184,879 B2 | 5/2012 | Geier et al. |
| 9,218,659 B2 | 12/2015 | Kim et al. |
| 10,386,443 B2 * | 8/2019 | Zeller ................ G01R 33/5611 |
| 2009/0278539 A1 * | 11/2009 | Beatty ................ G01R 33/5611 324/312 |

(Continued)

FOREIGN PATENT DOCUMENTS

WO 2016187148 A1 11/2016

OTHER PUBLICATIONS

Juliane Budde et al., Ultra-high resolution imaging of the human brain using Acquisition weighted imaging at 9.4T, NeuroImage 86, 2014, pp. 592-598.

*Primary Examiner* — Christopher P McAndrew
(74) *Attorney, Agent, or Firm* — Metis IP LLC

(57) ABSTRACT

A method for magnetic resonance imaging (MRI) may include obtaining a plurality of k-space datasets related to a scanning of a subject performed by an MRI scanner. The method may also include obtaining at least one filter for processing the plurality of k-space datasets, and applying the at least one filter to the plurality of k-space datasets convolutionally to obtain a plurality of processed k-space datasets. By applying the at least one filter, an application region extending through the plurality of k-space datasets may be determined within the plurality of k-space datasets, and a data point within the application region may be modified based at least on the other data points within the application region. The method may further include generating an image based on at least one of the processed k-space datasets.

19 Claims, 19 Drawing Sheets

(56) References Cited

U.S. PATENT DOCUMENTS

| | | | |
|---|---|---|---|
| 2009/0285463 A1* | 11/2009 | Otazo | G06T 3/4053 |
| | | | 382/131 |
| 2010/0308824 A1* | 12/2010 | Grady | G01R 33/5611 |
| | | | 324/309 |
| 2011/0148410 A1* | 6/2011 | Zaitsev | G01R 33/5611 |
| | | | 324/309 |
| 2013/0043867 A1* | 2/2013 | Corum | G01R 33/4616 |
| | | | 324/309 |
| 2014/0266192 A1* | 9/2014 | Taviani | G01R 33/561 |
| | | | 324/309 |
| 2014/0376794 A1* | 12/2014 | Dumoulin | G01R 33/5611 |
| | | | 382/131 |
| 2015/0192654 A1* | 7/2015 | Zhu | G01R 33/5611 |
| | | | 324/309 |
| 2015/0204961 A1* | 7/2015 | Ivancevic | G01R 33/5619 |
| | | | 324/309 |
| 2015/0346303 A1* | 12/2015 | Hu | G01R 33/5611 |
| | | | 600/420 |
| 2016/0232690 A1* | 8/2016 | Ahmad | G01R 33/445 |
| 2017/0234954 A1* | 8/2017 | Lee | G01R 33/4835 |
| | | | 324/309 |
| 2017/0234955 A1* | 8/2017 | Choi | G01R 33/5611 |
| | | | 324/309 |
| 2017/0234957 A1* | 8/2017 | Zho | G01R 33/443 |
| | | | 324/309 |
| 2017/0254869 A1* | 9/2017 | Miyazaki | G01R 33/482 |
| 2017/0276755 A1* | 9/2017 | Hoge | G01R 33/5616 |
| 2017/0285123 A1* | 10/2017 | Kaditz | G01R 33/48 |
| 2017/0307703 A1* | 10/2017 | Wiesinger | G01R 33/5616 |
| 2018/0120404 A1* | 5/2018 | Novikov | G06K 9/6247 |

* cited by examiner

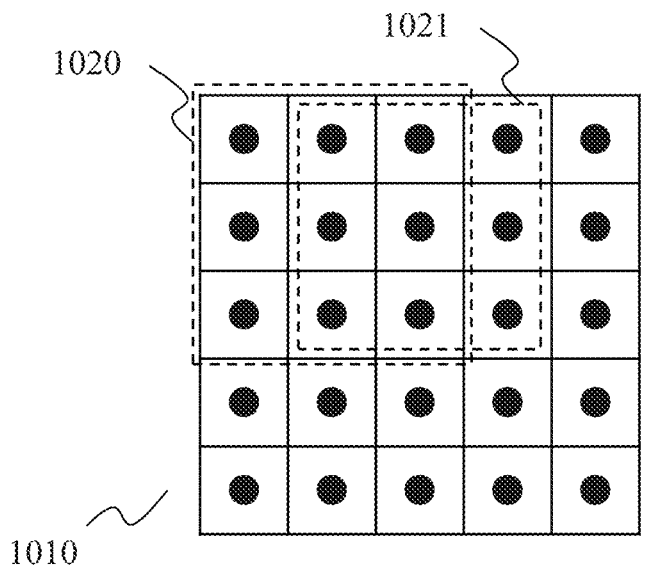
FIG. 10-A
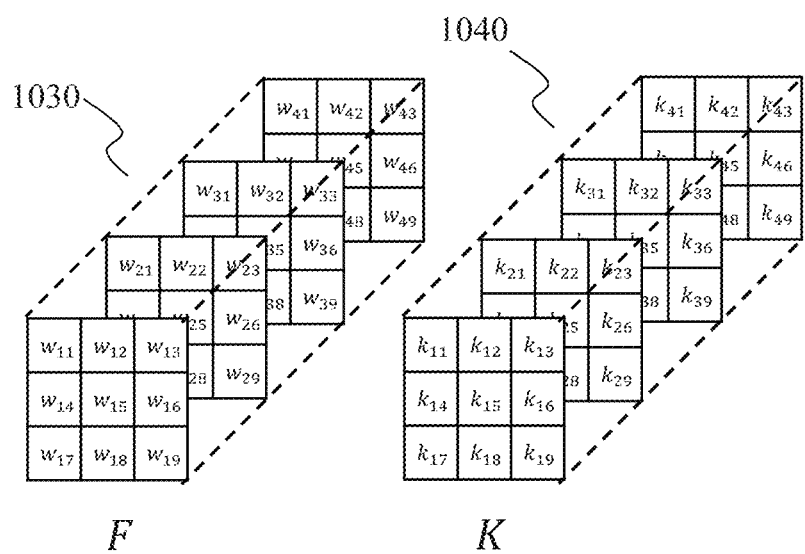
FIG. 10-B

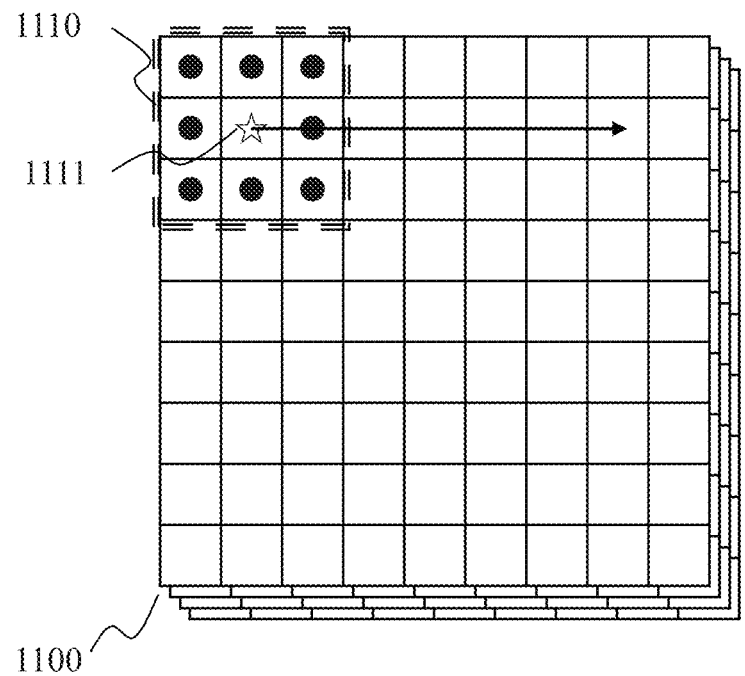
FIG. 11-A
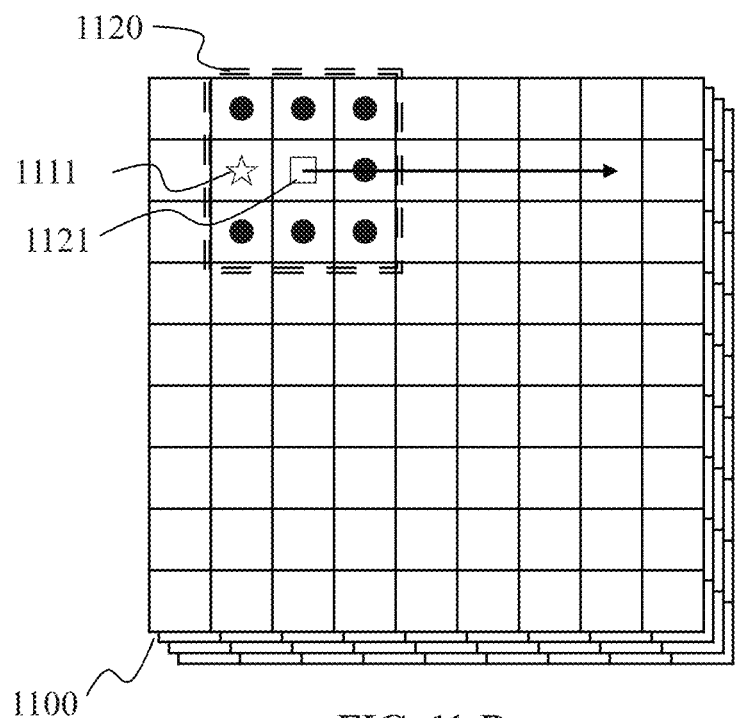
FIG. 11-B

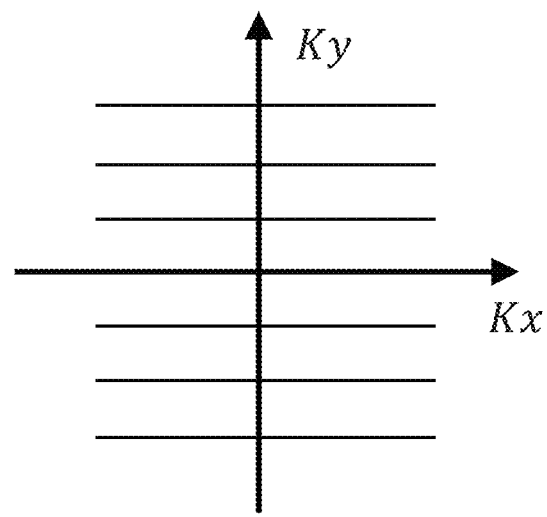
FIG. 12-A
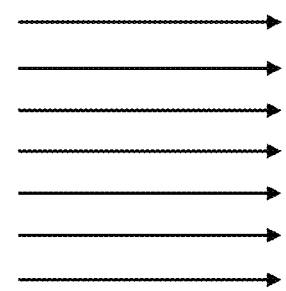
FIG. 12-B
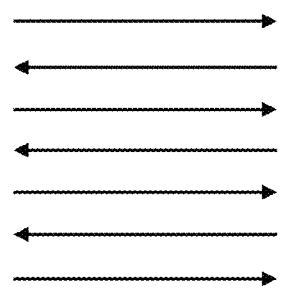
FIG. 12-C
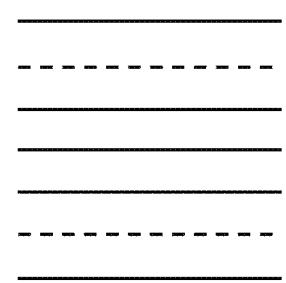
FIG. 12-D

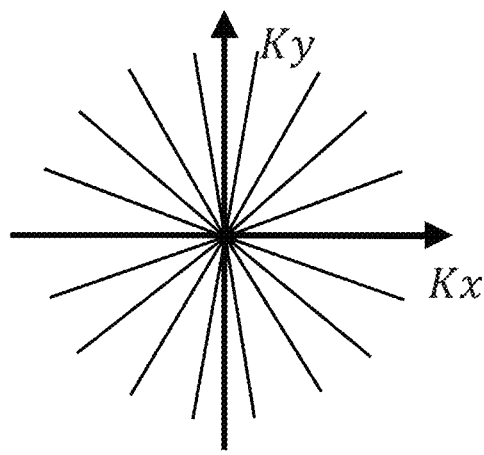 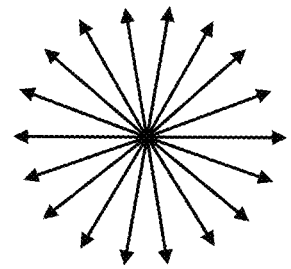
FIG. 13-A          FIG. 13-B
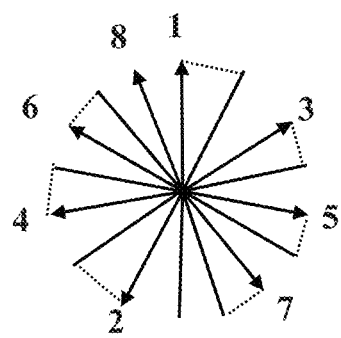 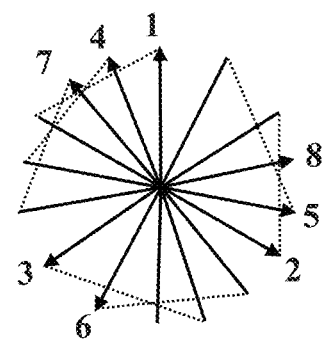
FIG. 13-C          FIG. 13-D
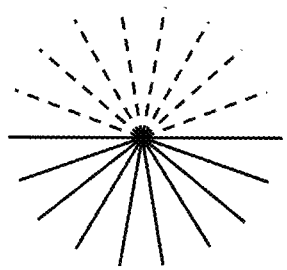 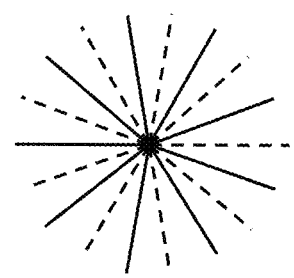
FIG. 13-E          FIG. 13-F

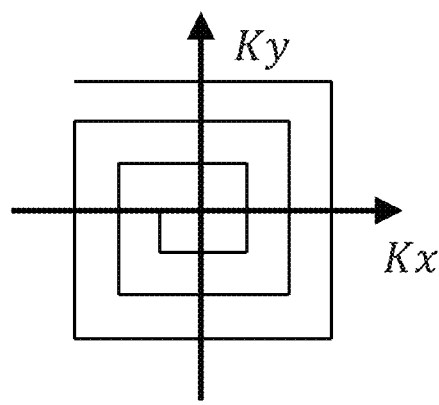
FIG. 14-A
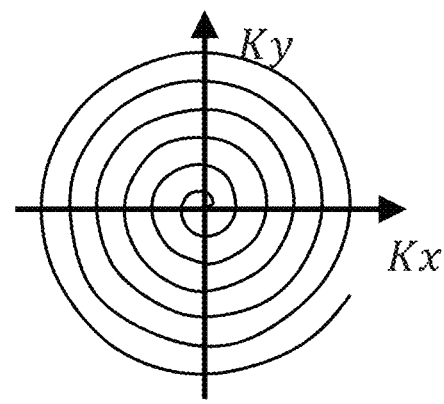
FIG. 14-B
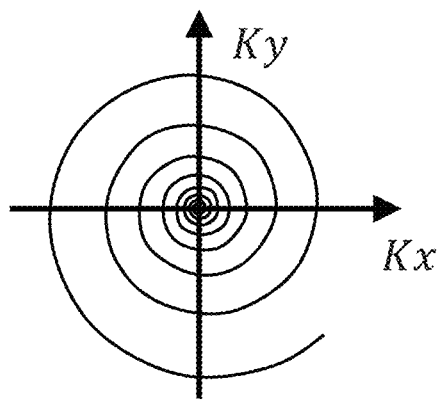
FIG. 14-C
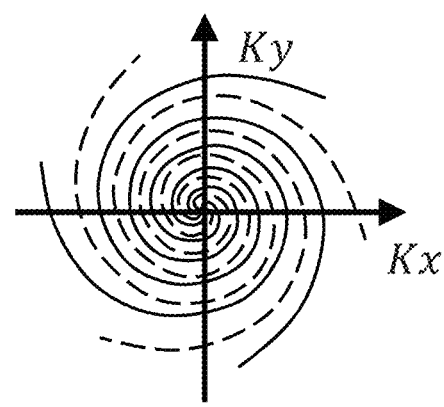
FIG. 14-D

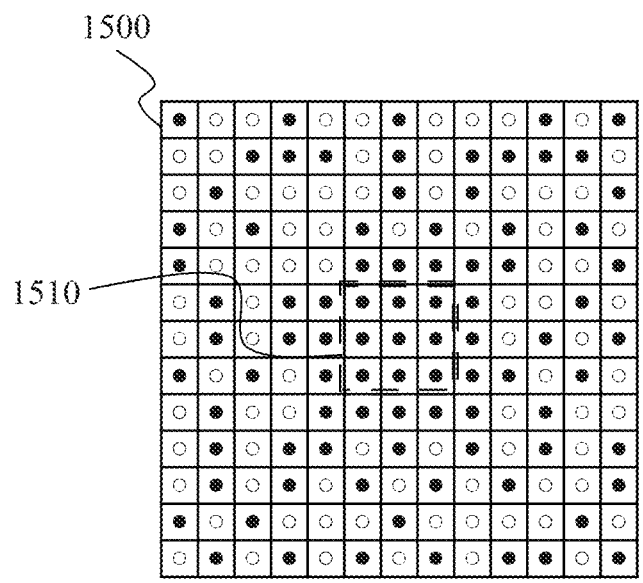
FIG. 15-A
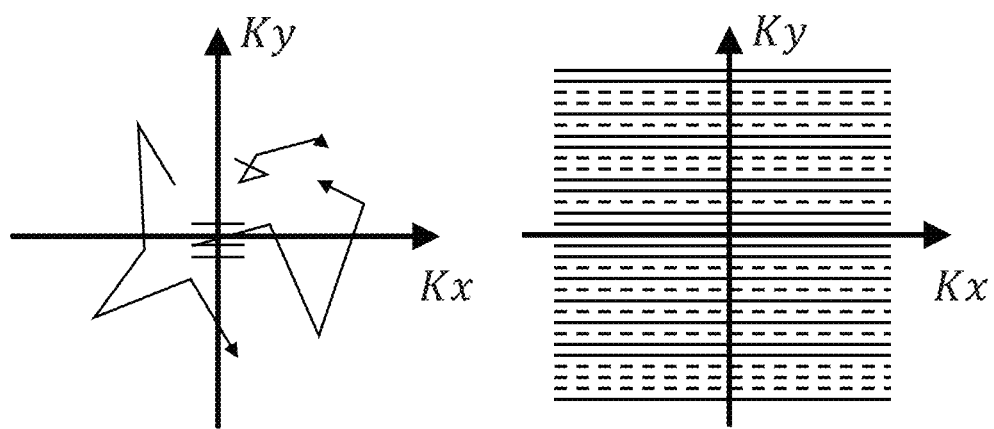
FIG. 15-B          FIG. 15-C

METHODS AND SYSTEMS FOR MAGNETIC RESONANCE IMAGING

TECHNICAL FIELD

The present invention generally relates to magnetic resonance imaging (MRI) or magnetic resonance spectroscopy (MRS), and more specifically to a method and apparatus for increasing the data acquisition speed while enhancing the signal noise ratio (SNR) for MRI or MRS.

BACKGROUND

Magnetic resonance imaging (MRI) is a non-invasive medical imaging technique that may be used to investigate the anatomy and/or physiology of a subject (e.g., human). An MRI scanner may also include modules for performing a magnetic resonance spectroscopic imaging (MRSI) to produce an MRS image. The MRS image may provide information regarding chemical elements in a certain area of the scan subject (e.g., patient) and thus be used for analyzing metabolic activity of that area (e.g., brain). The image quality of an MRI image and/or the precision of an MRS image may affect the accuracy of the diagnosis a doctor provides on the basis the MRI image and/or the MRS image. There is a need for techniques to improve the image quality (e.g., increased SNR, reduced artifacts) of an MRI image and the precision of an MRS image.

SUMMARY

According an aspect of the present disclosure, a method may include obtaining a plurality of k-space datasets related to a scanning of a subject performed by an MRI scanner. Each of the plurality of k-space datasets may include a plurality of data points. The plurality of data points may include data points sampled by the MRI scanner. The method may also include obtaining at least one filter for processing the plurality of k-space datasets. The filter may include a plurality of weighting factors. The method may further include applying the at least one filter to the plurality of k-space datasets convolutionally to obtain a plurality of processed k-space datasets. By applying the at least one filter, an application region extending through the plurality of k-space datasets may be determined within the plurality of k-space datasets, and a data point within the application region may be modified based at least on the other data points within the application region and the plurality of weighting factors. The method may also include generating an image based on at least one of the processed k-space datasets. During the convolutional application of the at least one filter to the plurality of k-space datasets, at least some of the data points sampled by the MRI scanner may be modified with the at least one filter.

In some embodiments, the MRI scanner may include a plurality of coils. The obtaining the plurality of k-space datasets may include: receiving, by the plurality of coils, MR signals related to the scanning of the subject; obtaining, by the at least one processor, a fully-sampled k-space dataset from MR signals received by each of the plurality of coils; and designating the obtained fully-sampled k-space datasets as the plurality of k-space datasets.

In some embodiments, the MRI scanner may include a plurality of coils, the obtaining the plurality of k-space datasets may include: receiving, by the plurality of coils, MR signals related to a first scanning of the subject; obtaining a first k-space dataset from MR signals received by each of the plurality of coils; receiving; by the plurality of coils; MR signals related to a second scanning of the subject; obtaining a second k-space dataset from MR signals received by each of the plurality of coils; and generating the plurality of k-space datasets based on at least some of the data points of the first k-space datasets and at least some of the data points of the second k-space datasets. The obtained second k-space datasets may be under-sampled datasets.

In some embodiments, the MRI scanner may include a plurality of coils. The obtaining the plurality of k-space datasets may comprising: receiving, by the plurality of coils, MR signals related to the scanning of the subject; obtaining, by the at least one processor, an under-sampled k-space dataset from the MR signals received by each of the plurality of coils, each under-sampled k-space dataset including at least one sampled data point and at least one unsampled data point; and generating, by the at least one processor, the plurality of k-space datasets by filling the under-sampled k-space datasets with the unsampled data points reconstructed based on the sampled data points of the obtained under-sampled k-space datasets.

In some embodiments, the under-sampled k-space datasets may be obtained using a sampling pattern relative to a compressed sensing based technique. The method may further include generating the plurality of k-space datasets by applying a compressed sensing reconstruction technique on the under-sampled k-space datasets.

In some embodiments, the obtaining the at least one filter may include determining a fully-sampled calibration region within the plurality of k-space datasets; and determining the plurality of weighting factors based on the data points within the calibration region. The calibration region may extend through the plurality of k-space datasets In some embodiments, the MRI scanner may include a plurality of coils, the obtaining the plurality of k-space datasets may include: receiving, by the plurality of coils, MR signals related to the scanning of the subject; and generating a k-space dataset based on the MR signals received by each of the plurality of coils to obtain the plurality of k-space datasets. The scanning may be performed using a weighting function causing the data points closer to a center of a k-space dataset being sampled for more times.

In some embodiments, the plurality of k-space datasets may include a fully-sampled region extending through the plurality of k-space datasets. The obtaining the at least one filter may include generating a plurality of filters based on data points of the fully-sampled region. One of the plurality of filters may correspond to one of the plurality of k-space datasets. The applying the at least one filter to the plurality of k-space datasets convolutionally may include applying each of the plurality of filters to a corresponding k-space dataset of the plurality of k-space datasets.

In some embodiments, the plurality of k-space datasets may further include an under-sampled region extending through the plurality of k-space datasets. The under-sampled region may include unsampled data points. The fully-sampled region may be a central region of the plurality of k-space dataset. The under-sampled region may be a surrounding region. The applying the at least one filter to the plurality of k-space datasets convolutionally may include applying the plurality of filters to the fully-sampled region of the k-space datasets convolutionally to obtain a processed fully-sampled region; and reconstructing the unsampled data points of the under-sampled region based on data points of the processed fully-sampled region to obtain a filled region.

In some embodiments, the method may further comprise applying the plurality of filters to the filled region, during which at least some of sampled data points of the filled region may be modified with the plurality of filter.

In some embodiments, the image may be a magnetic resonance spectrum image or a magnetic resonance spectroscopic image.

In some embodiments, the data point within the application region may be determined based on all the data points within the application region and the plurality of weighting factors.

In some embodiments, the applying the filter to the plurality of k-space datasets convolutionally may include: determining a region extending through the k-space datasets for applying the filter; determining at least one trajectory throughout the region; determining a first application region along the at least one trajectory; processing a first data point within the first application region by applying the filter to the first application region; determining a second application region along the at least one trajectory; and processing a second data point within the first application region by applying the filter to the second application region. The first data point may be included in the second application region and the second data point may be processed based on the processed first data point.

According another aspect of the present disclosure, a method for magnetic resonance imaging (MRI) may include causing an MRI scanner to acquire MR data related to a subject. The method may also include entering the MR data into a plurality of k-space datasets by sampling the MR data using an acquisition weighting technique or a density weighting technique. Each of the plurality of k-space datasets may include at least one fully-sampled region filled with sampled k-space lines. The method may further include: for each of the plurality of k-space datasets, obtaining a convolution filter based on the at least one fully-sampled region, and producing a modified k-space dataset by applying the convolution filter to the k-space dataset. The method may also include reconstructing an image of the subject using the modified k-space datasets.

In some embodiments, the MR data may be sampled further using a compressed sensing based technique.

In some embodiments, the each of the plurality of k-space datasets may include at least one under-sampled region with unsampled K-space lines.

In some embodiments, the at least one fully-sampled region may be in a center of the each of the plurality of k-space datasets, and the at least one under-sampled region may be in a corner of each of the plurality of k-space dataset.

In some embodiments, the producing the modified k-space dataset by applying the convolution filter to the k-space dataset may include: modifying the k-space lines of the fully-sampled region by applying the convolution filter to generate modified k-space lines; and estimating k-space line data for the un-sampled k-space lines based on the modified k-space lines.

In some embodiments, the method may further include modifying the un-sampled k-space lines based on the modified k-space lines.

According yet to another aspect of the present disclosure, a system may include at least one processor and at least one storage for storing instructions. The instructions, when executed by the at least one processor, may cause the system to obtain a plurality of k-space datasets related to a scanning of a subject performed by an MRI scanner. Each of the plurality of k-space datasets may include a plurality of data points, and the plurality of data points may include data points sampled by the MRI scanner. The system may also be caused to obtain at least one filter for processing the plurality of k-space datasets. The filter may include a plurality of weighting factors. The system may further be caused to apply the at least one filter to the plurality of k-space datasets convolutionally to obtain a plurality of processed k-space datasets. By applying the at least one filter, an application region extending through the plurality of k-space datasets may be determined within the plurality of k-space datasets, and a data point within the application region may be modified based at least on the other data points within the application region and the plurality of weighting factors. The system may also be caused to generate an image based on at least one of the processed k-space datasets. During the convolutional application of the at least one filter to the plurality of k-space datasets, at least some of the data points sampled by the MRI scanner may be modified with the at least one filter.

According yet to another aspect of the present disclosure, a system for magnetic resonance imaging may comprise at least one processor and at least one storage for storing instructions. The instructions, when executed by the at least one processor, may cause the system to cause an MRI scanner to acquire MR data related to a subject. The system may also be caused to enter the MR data into a plurality of k-space datasets by sampling the MR data using an acquisition weighting technique or a density weighting technique. Each of the plurality of k-space datasets may include at least one fully-sampled region filled with sampled k-space lines. For each of the plurality of k-space datasets, the system may further be caused to obtain a convolution filter based on the at least one fully-sampled region, and produce a modified k-space dataset by applying the convolution filter to the k-space dataset. The system may also be caused to reconstruct an image of the subject using the modified k-space datasets.

According yet to another aspect of the present disclosure, a system may include a data acquisition module, which may be configured to obtain a plurality of k-space datasets related to a scanning of a subject performed by an MRI scanner. Each of the plurality of k-space datasets may include a plurality of data points, and the plurality of data points may include data points sampled by the MRI scanner. The system may also include a filter module, which may be configured to obtain at least one filter for processing the plurality of k-space datasets. The filter may include a plurality of weighting factors. The system may further include a filter application module, which may be configured to apply the at least one filter to the plurality of k-space datasets convolutionally to obtain a plurality of processed k-space datasets. By applying the at least one filter, an application region extending through the plurality of k-space datasets may be determined within the plurality of k-space datasets, and a data point within the application region may be modified based at least on the other data points within the application region and the plurality of weighting factors. The system may also include an image module, which may be configured to generate an image based on at least one of the processed k-space datasets. During the convolutional application of the at least one filter to the plurality of k-space datasets, at least some of the data points sampled by the MRI scanner may be modified with the at least one filter.

According yet to another aspect of the present disclosure, a system for magnetic resonance imaging may include a scanner control module, a data acquisition module, a filter module, a filter application module, and an image module. The scanner control module may be configured to cause an MRI scanner to acquire MR data related to a subject. The data acquisition module may be configured to enter the MR data into a plurality of k-space datasets by sampling the MR data using an acquisition weighting technique or a density weighting technique. Each of the plurality of k-space datasets may include at least one fully-sampled region filled with sampled k-space lines. For each of the plurality of k-space datasets, the filter module may be configured to obtain a convolution filter based on the at least one fully-sampled region, and the filter application module may be configured to produce a modified k-space dataset by applying the convolution filter to the k-space dataset. The image module may be configured to reconstruct an image of the subject using the modified k-space datasets.

According yet to another aspect of the present disclosure, a non-transitory computer readable medium may store instructions. The instructions, when executed by a processor, may cause the processor to execute operations. The operations may include obtaining a plurality of k-space datasets related to a scanning of a subject performed by an MRI scanner. Each of the plurality of k-space datasets may include a plurality of data points. The plurality of data points may include data points sampled by the MRI scanner. The operations may also include obtaining at least one filter for processing the plurality of k-space datasets. The filter may include a plurality of weighting factors. The operations may further include applying the at least one filter to the plurality of k-space datasets convolutionally to obtain a plurality of processed k-space datasets. By applying the at least one filter, an application region extending through the plurality of k-space datasets may be determined within the plurality of k-space datasets, and a data point within the application region may be modified based at least on the other data points within the application region and the plurality of weighting factors. The operations may also include generating an image based on at least one of the processed k-space datasets. During the convolutional application of the at least one filter to the plurality of k-space datasets, at least some of the data points sampled by the MRI scanner may be modified with the at least one filter.

According yet to another aspect of the present disclosure, a non-transitory computer readable medium may store instructions. The instructions, when executed by a processor, may causing the processor to execute operations. The operations may include causing an MRI scanner to acquire MR data related to a subject. The operations may also include entering the MR data into a plurality of k-space datasets by sampling the MR data using an acquisition weighting technique or a density weighting technique, each of the plurality of k-space datasets including at least one fully-sampled region filled with sampled k-space lines. The operations may further include: for each of the plurality of k-space datasets, obtaining a convolution filter based on the at least one fully-sampled region, and producing a modified k-space dataset by applying the convolution filter to the k-space dataset. The operations may also include reconstructing an image of the subject using the modified k-space datasets.

Additional features will be set forth in part in the description which follows, and in part will become apparent to those skilled in the art upon examination of the following and the accompanying drawings or may be learned by production or operation of the examples. The features of the present disclosure may be realized and attained by practice or use of various aspects of the methodologies, instrumentalities and combinations set forth in the detailed examples discussed below.

BRIEF DESCRIPTIONS OF THE DRAWINGS

The present disclosure is further described in terms of exemplary embodiments. These exemplary embodiments are described in detail with reference to the drawings. These embodiments are non-limiting exemplary embodiments, in which like reference numerals represent similar structures throughout the several views of the drawings, and wherein.

Figure 16:
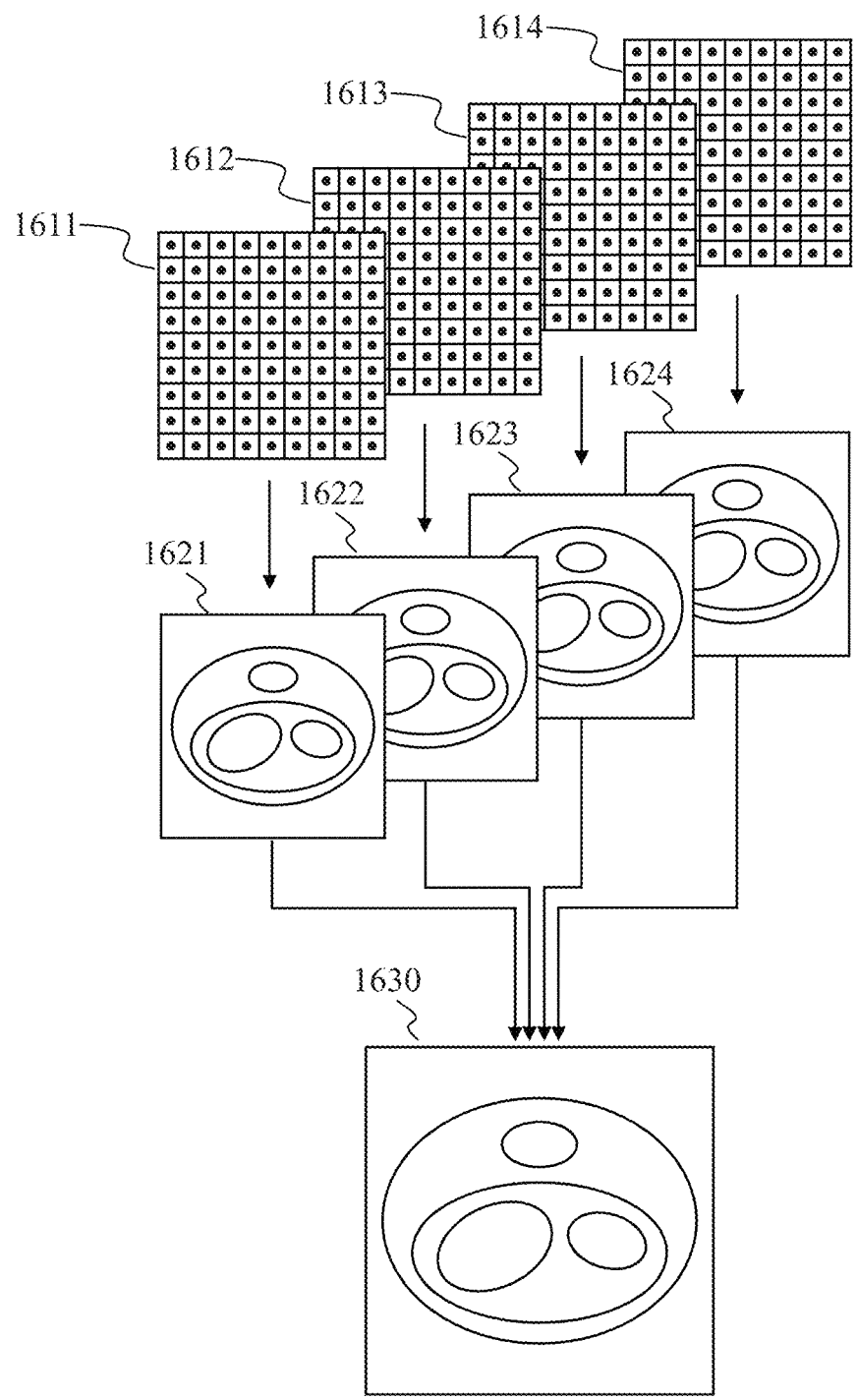
Figure 17:
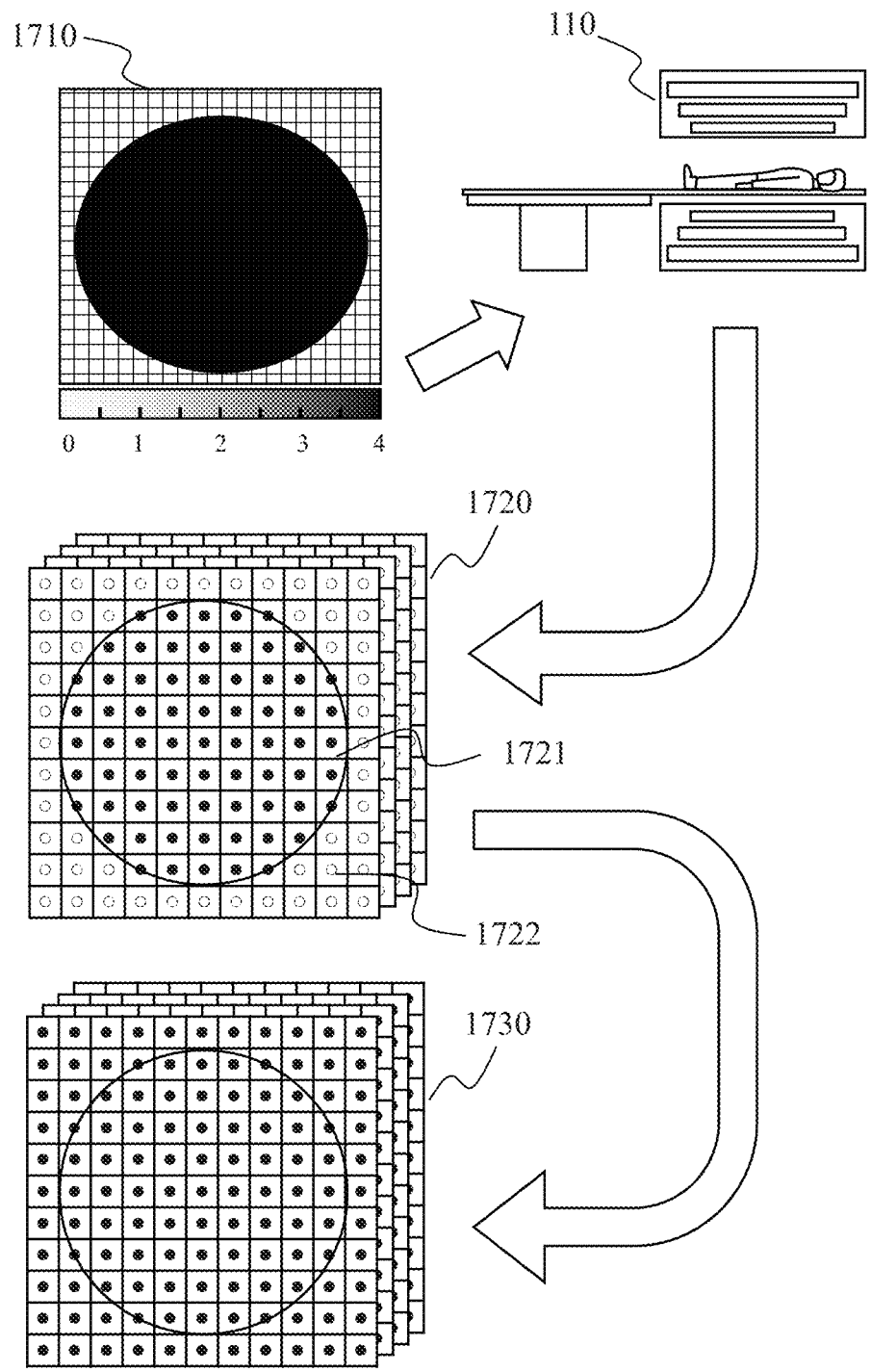
Figure 18:
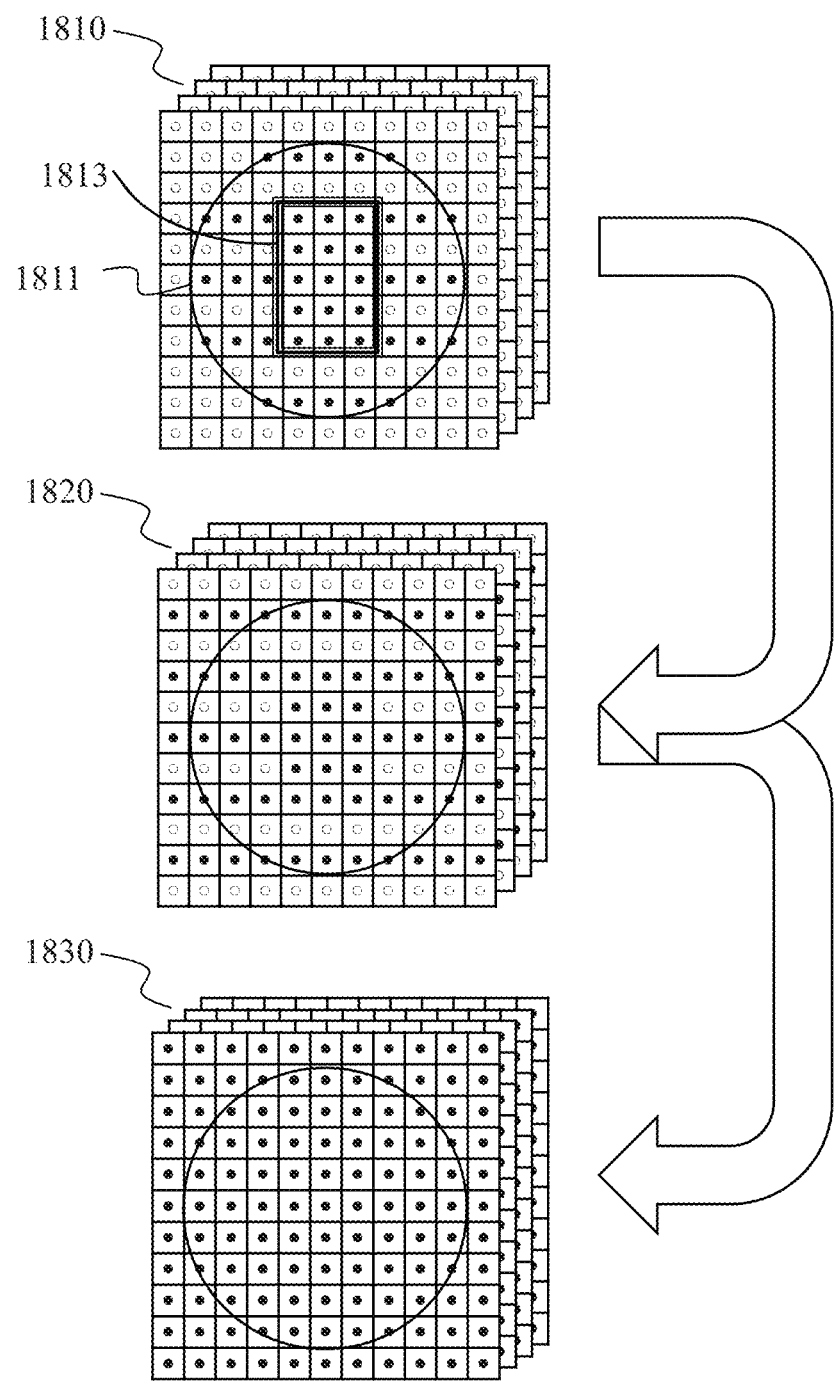
Figure 19:
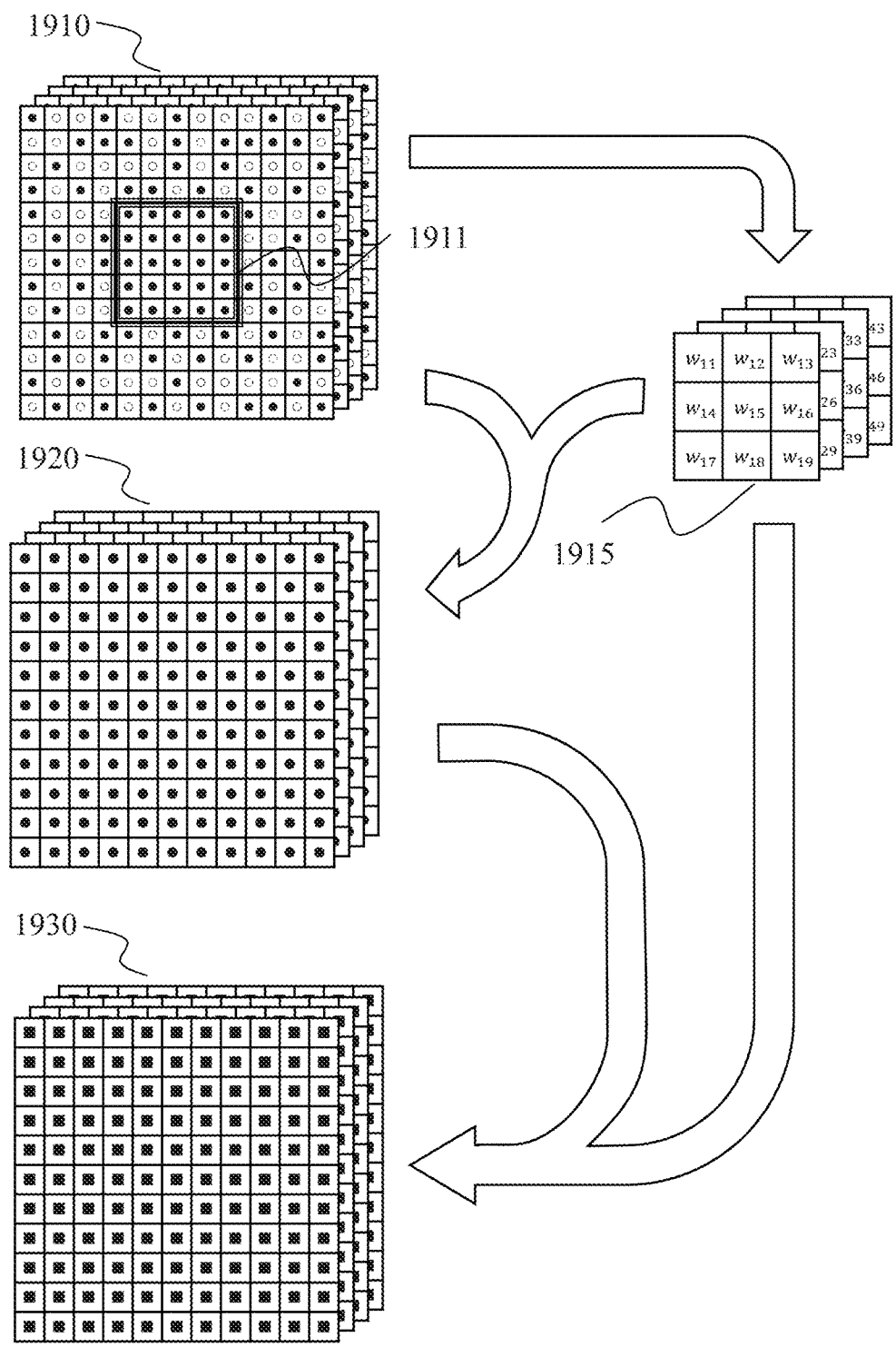
Figure 20:
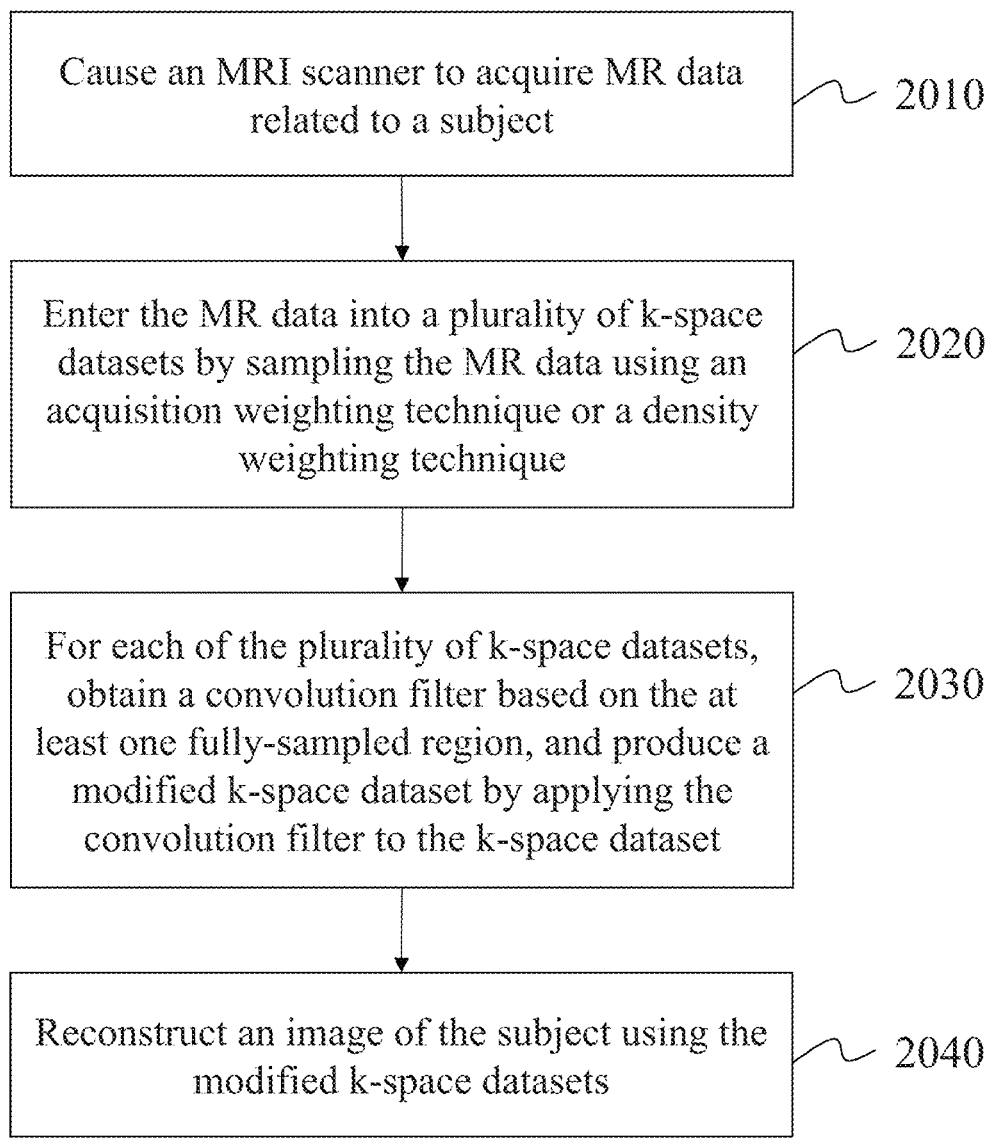

FIG. 10-A is a schematic diagram illustrating an exemplary calibration region for determining weighting factors of a filter according to some embodiments of the present disclosure;

FIG. 10-B is a schematic diagram illustrating an exemplary filter and an exemplary application region according to some embodiment of the present disclosure;

FIGS. 11-A and 11-B are schematic diagram illustrating exemplary processes for applying a filter to the plurality of k-space datasets convolutionally according to some embodiments of the present disclosure;

FIGS. 12-A to 14-D are schematic diagrams illustrating exemplary sampling trajectories for acquiring MR signals to generate k-space datasets according to some embodiments of the present disclosure;

FIGS. 15-A to 15-C are schematic diagrams illustrating exemplary sampling patterns for acquiring MR signals based on a compressed sensing technique according to some embodiments of the present disclosure;

FIG. 16 is a schematic diagram illustrating an exemplary process for generating an MRI image based on multiple processed k-space datasets according to some embodiments of the present disclosure;

FIG. 17 is a schematic diagram illustrating an exemplary process for generating k-space datasets according to some embodiments of the present disclosure;

FIG. 18 is a schematic diagram illustrating an exemplary process for generating the k-space datasets according to some embodiments of the present disclosure;

FIG. 19 is a schematic diagram illustrating an exemplary process for generating the k-space datasets according to some embodiments of the present disclosure; and FIG. 20 is a schematic diagram illustrating an exemplary process for processing the k-space datasets according to some embodiments of the present disclosure.

DETAILED DESCRIPTION

The present disclosure is directed to a system and method for processing k-space datasets to improve the image quality of an image generated therefrom. According to some embodiments, a filter may be used to process a plurality of full k-space datasets convolutionally.

In the following detailed description, numerous specific details are set forth by way of examples in order to provide a thorough understanding of the relevant disclosure. However, it should be apparent to those skilled in the art that the present disclosure may be practiced without such details. In other instances, well known methods, procedures, systems, components, and/or circuitry have been described at a relatively high-level, without detail, in order to avoid unnecessarily obscuring aspects of the present disclosure. Various modifications to the disclosed embodiments will be readily apparent to those skilled in the art, and the general principles defined herein may be applied to other embodiments and applications without departing from the spirit and scope of the present disclosure. Thus, the present disclosure is not limited to the embodiments shown, but to be accorded the widest scope consistent with the claims.

The terminology used herein is for the purpose of describing particular example embodiments only and is not intended to be limiting. As used herein, the singular forms "a", "an", and "the" may be intended to include the plural forms as well, unless the context clearly indicates otherwise. It will be further understood that the terms "comprise", "comprises", and/or "comprising", "include", "includes", and/or "including", when used in this specification, specify the presence of stated features, integers, steps, operations, elements, and/or components, but do not preclude the presence or addition of one or more other features, integers, steps, operations, elements, components, and/or groups thereof.

It will be understood that the term "system," "unit," "module," and/or "block" used herein are one method to distinguish different components, elements, parts, section or assembly of different level in ascending order. However, the terms may be displaced by another expression if they achieve the same purpose.

Generally, the word "module," "sub-module," "unit," or "block," as used herein, refers to logic embodied in hardware or firmware, or to a collection of software instructions. A module, a unit, or a block described herein may be implemented as software and/or hardware and may be stored in any type of non-transitory computer-readable medium or another storage device. In some embodiments, a software module/unit/block may be compiled and linked into an executable program. It will be appreciated that software modules can be callable from other modules/units/blocks or from themselves, and/or may be invoked in response to detected events or interrupts.

Software modules/units/blocks configured for execution on computing devices (e.g., processor 210 as illustrated in FIG. 2A) may be provided on a computer-readable medium, such as a compact disc, a digital video disc, a flash drive, a magnetic disc, or any other tangible medium, or as a digital download (and can be originally stored in a compressed or installable format that needs installation, decompression, or decryption prior to execution). Such software code may be stored, partially or fully, on a storage device of the executing computing device, for execution by the computing device. Software instructions may be embedded in a firmware, such as an EPROM. It will be further appreciated that hardware modules/units/blocks may be included in connected logic components, such as gates and flip-flops, and/or can be included of programmable units, such as programmable gate arrays or processors. The modules/units/blocks or computing device functionality described herein may be implemented as software modules/units/blocks, but may be represented in hardware or firmware. In general, the modules/units/blocks described herein refer to logical modules/units/blocks that may be combined with other modules/units/blocks or divided into sub-modules/sub-units/sub-blocks despite their physical organization or storage. The description may be applicable to a system, a device, or a portion thereof.

It will be understood that when a unit, device, module or block is referred to as being "on," "connected to," or "coupled to," another unit, device, module, or block, it may be directly on, connected or coupled to, or communicate with the other unit, device, module, or block, or an intervening unit, device, module, or block may be present, unless the context clearly indicates otherwise. As used herein, the term "and/or" includes any and all combinations of one or more of the associated listed items.

These and other features, and characteristics of the present disclosure, as well as the methods of operation and functions of the related elements of structure and the combination of parts and economies of manufacture, may become more apparent upon consideration of the following description with reference to the accompanying drawings, all of which form a part of this disclosure. It is to be expressly understood, however, that the drawings are for the purpose of illustration and description only and are not intended to limit the scope of the present disclosure.

Figure 1:
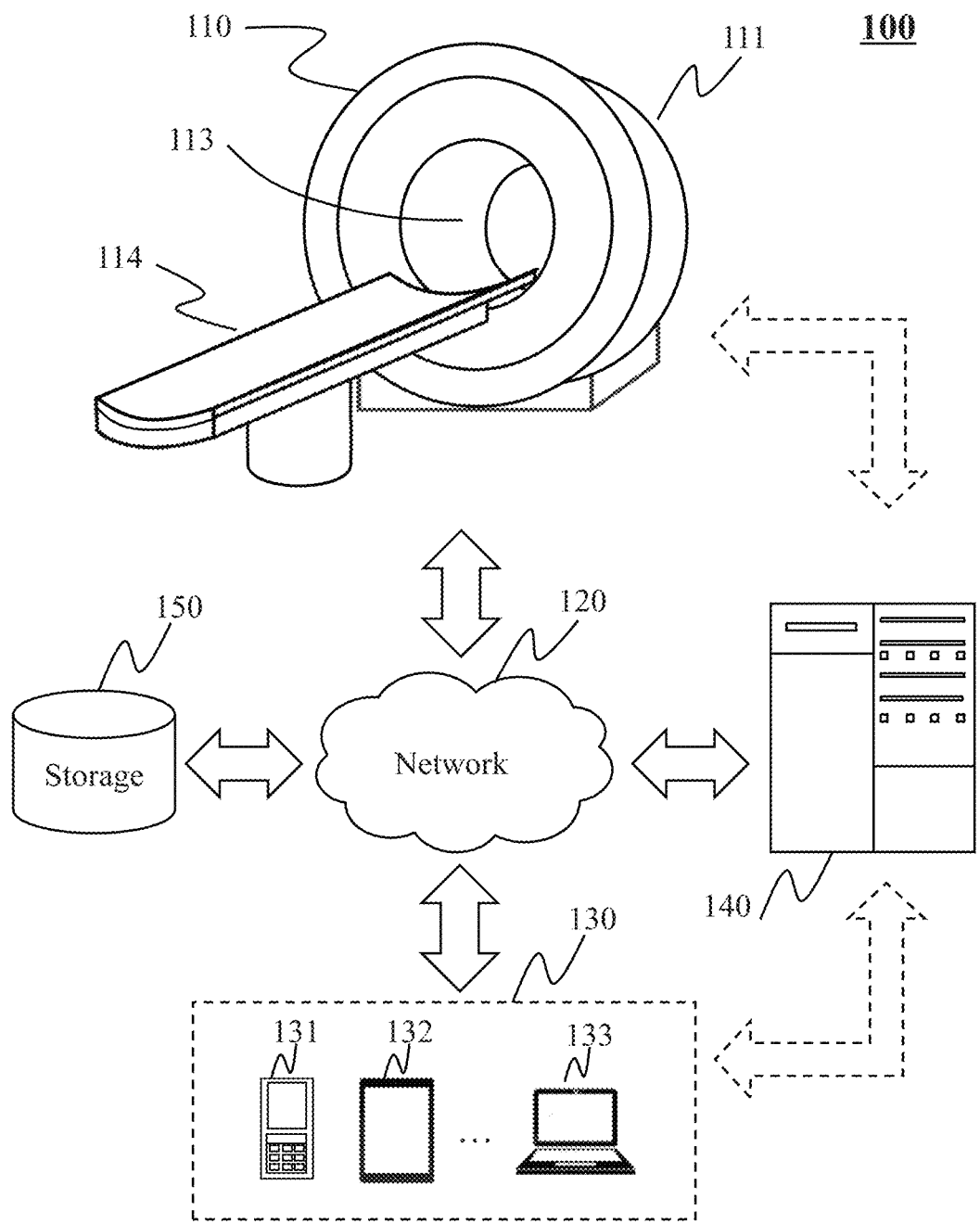
FIG. 1 is a schematic diagram illustrating an exemplary imaging system according to some embodiments of the present disclosure.

FIG. 1 is a schematic diagram illustrating an exemplary imaging system according to some embodiments of the present disclosure. As shown, the imaging system 100 may include an MRI scanner 110, a network 120, one or more terminals 130, a processing device 140, and a storage device 150.

The MRI scanner 110 may include a gantry 111, a detection region 113, and a table 114. The gantry 111 may include a plurality of coils (not shown) for performing an MRI scanning. A subject may be placed on the table 114 for scanning. The subject may be a patient, an experiment subject, a container, an imaging performance analysis subject for the scanner 110 (e.g., a phantom), or the like, or any combination thereof. The scanner 110 may acquire scan data for generating an image by scanning the subject. The scan data may be sampled in the Fourier space (k-space). Descriptions of an exemplary structure of the MRI scanner 110 and MR data acquisition are provided elsewhere in the present disclosure (e.g., in connection with FIGS. 5 and 6).

The network 120 may include any suitable network that can facilitate the exchange of information and/or data for the imaging system 100. In some embodiments, one or more components of the imaging system 100 (e.g., the MRI scanner 110, the terminal 130, the processing device 140, the storage device 150) may communicate information and/or data with one or more other components of the imaging system 100 via the network 120. For example, the processing device 140 may obtain scan data from the MRI scanner 110 via the network 120. As another example, the processing device 140 may obtain user instructions from the terminal 130 via the network 120. The network 120 may be and/or include a public network (e.g., the Internet), a private network (e.g., a local area network (LAN), a wide area network (WAN)), a wired network (e.g., an Ethernet network), a wireless network (e.g., an 802.11 network, a Wi-Fi network), a cellular network (e.g., a Long Term Evolution (LTE) network), a frame relay network, a virtual private network ("VPN"), a satellite network, a telephone network, routers, hubs, switches, server computers, and/or any combination thereof. Merely by way of example, the network 120 may include a cable network, a wireline network, a fiber-optic network, a telecommunications network, an intranet, a wireless local area network (WLAN), a metropolitan area network (MAN), a public telephone switched network (PSTN), a Bluetooth™ network, a ZigBee™ network, a near field communication (NFC) network, or the like, or any combination thereof. In some embodiments, the network 120 may include one or more network access points. For example, the network 120 may include wired and/or wireless network access points such as base stations and/or internet exchange points through which one or more components of the imaging system 100 may be connected to the network 120 to exchange data and/or information.

The terminal(s) 130 may include a mobile device 131, a tablet computer 132, a laptop computer 133, or the like, or any combination thereof. In some embodiments, the mobile device 131 may include, a wearable device, a mobile device, a virtual reality device, an augmented reality device, or the like, or any combination thereof. In some embodiments, the wearable device may include a bracelet, footgear, eyeglasses, a helmet, a watch, clothing, a backpack, a smart accessory, or the like, or any combination thereof. In some embodiments, the mobile device may include a mobile phone, a personal digital assistance (PDA), a laptop, a tablet computer, a desktop, or the like, or any combination thereof. In some embodiments, the virtual reality device and/or the augmented reality device may include a virtual reality helmet, virtual reality glasses, a virtual reality patch, an augmented reality helmet, augmented reality glasses, an augmented reality patch, or the like, or any combination thereof. For example, the virtual reality device and/or the augmented reality device may include a Google Glass™, an Oculus Rift™, a Hololens™, a Gear VR™, etc. In some embodiments, the terminal(s) 130 may be part of the processing device 140.

The processing device 140 may process data and/or information obtained from the MRI scanner 110, the terminal 130, and/or the storage device 150. For example, the processing device 140 may be configured to process the scan data acquired by the MRI scanner 110 and generate an image therefrom. The image used herein may include 2-D image, 3-D image, videos, charts or tables for displaying information, the corresponding digital files or datasets, etc. The processing device 140 may also be configured to control one or more components of the imaging system 100. For example, the processing device 140 may be configured to control the scanner 110 to scan a subject and sample the scan data into one or more k-space datasets. The processing device 140 may then process the data of the one or more k-space datasets to generate the image of the subject. Descriptions of the processing device 140 are provided elsewhere in the present disclosure (e.g., in connection with FIG. 4).

The processing device 140 may be a computer, a user console, a single server, or a server group (centralized or distributed), etc. The processing device 140 may be local or remote. For example, the processing device 140 may access information and/or data stored in the scanner 110, the terminal 130, and/or the storage device 150 via the network 120. As another example, the processing device 140 may be directly connected to the scanner 110, the terminal 130 and/or the storage device 150 to access stored information and/or data. In some embodiments, the processing device 140 may be implemented on a cloud platform. Merely by way of example, the cloud platform may include a private cloud, a public cloud, a hybrid cloud, a community cloud, a distributed cloud, an inter-cloud, a multi-cloud, or the like, or any combination thereof. In some embodiments, the processing device 140 may be implemented by a computing device 200 having one or more components illustrated in FIG. 2.

The storage device 150 may store data, instructions, and/or any other information. In some embodiments, the storage device 150 may store data obtained from the terminal 130 and/or the processing device 140. In some embodiments, the storage device 150 may store data and/or instructions that the processing device 140 may execute or use to perform exemplary methods described in the present disclosure. In some embodiments, the storage device 150 may include a mass storage device, a removable storage device, a volatile read-and-write memory, a read-only memory (ROM), or the like, or any combination thereof. Exemplary mass storage may include a magnetic disk, an optical disk, a solid-state drive, etc. Exemplary removable storage may include a flash drive, a floppy disk, an optical disk, a memory card, a zip disk, a magnetic tape, etc. Exemplary volatile read-and-write memory may include a random access memory (RAM). Exemplary RAM may include a dynamic RAM (DRAM), a double date rate synchronous dynamic RAM (DDR SDRAM), a static RAM (SRAM), a thyristor RAM (T-RAM), and a zero-capacitor RAM (Z-RAM), etc. Exemplary ROM may include a mask ROM (MROM), a programmable ROM (PROM), an erasable programmable ROM (EPROM), an electrically erasable programmable ROM (EEPROM), a compact disk ROM (CD-ROM), and a digital versatile disk ROM, etc. In some embodiments, the storage device 150 may be implemented on a cloud platform. Merely by way of example, the cloud platform may include a private cloud, a public cloud, a hybrid cloud, a community cloud, a distributed cloud, an inter-cloud, a multi-cloud, or the like, or any combination thereof.

In some embodiments, the storage device 150 may be connected to the network 120 to communicate with one or more other components in the Imaging system 100 (e.g., the processing device 140, the terminal 130). One or more components of the imaging system 100 may access the data or instructions stored in the storage device 150 via the network 120. In some embodiments, the storage device 150 may be directly connected to or communicate with one or more other components of the imaging system 100 (e.g., the processing device 140, the terminal 130). In some embodiments, the storage device 150 may be part of the processing device 140.

Figure 2:
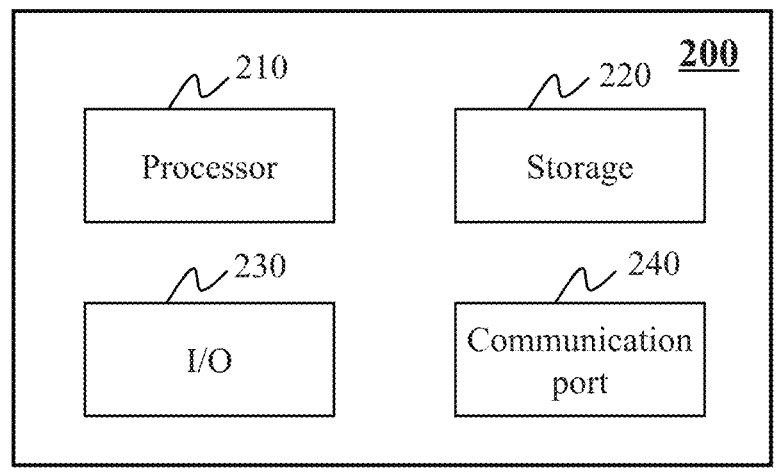
FIG. 2 is a schematic diagram illustrating exemplary components of an exemplary computing device according to some embodiments of the present disclosure.

FIG. 2 is a schematic diagram illustrating exemplary components of an exemplary computing device according to some embodiments of the present disclosure. The processing device 140 may be implemented on computing device 200. As illustrated in FIG. 2, the computing device 200 may include a processor 210, storage 220, an input/output (I/O) 230, and a communication port 240.

The processor 210 may execute computer instructions (e.g., program code) and perform functions of the processing device 140 in accordance with techniques described herein. The computer instructions may include, for example, routines, programs, objects, components, data structures, procedures, modules, and functions, which perform particular functions described herein. For example, the processor 210 may be configured to control the MRI scanner 110 to perform a scanning on a subject and generate one or more k-space datasets therefrom, process the obtained k-space datasets, and/or generate an image based on the processed datasets.

In some embodiments, the processor 210 may include one or more hardware processors, such as a microcontroller, a microprocessor, a reduced instruction set computer (RISC), an application specific integrated circuits (ASICs), an application-specific instruction-set processor (ASIP), a central processing unit (CPU), a graphics processing unit (GPU), a physics processing unit (PPU), a microcontroller unit, a digital signal processor (DSP), a field-programmable gate array (FPGA), an advanced RISC machine (ARM), a programmable logic device (PLD), any circuit or processor capable of executing one or more functions, or the like, or any combinations thereof.

Merely for illustration, only one processor is described in the computing device 200. However, it should be noted that the computing device 200 in the present disclosure may also include multiple processors, thus steps and/or method steps that are performed by one processor as described in the present disclosure may also be jointly or separately performed by the multiple processors. For example, if in the present disclosure the processor of the computing device 200 executes both step A and step B, it should be understood that step A and step B may also be performed by two or more different processors jointly or separately in the computing device 200 (e.g., a first processor executes step A and a second processor executes step B, or the first and second processors jointly execute steps A and B).

The storage 220 may store data/information obtained from the scanner 110, the terminal 130, the storage device 150, and/or any other component of the imaging system 100. In some embodiments, the storage 220 may include a mass storage, removable storage, a volatile read-and-write memory, a read-only memory (ROM), or the like, or any combination thereof. For example, the mass storage may include a magnetic disk, an optical disk, a solid-state drive, etc. The removable storage may include a flash drive, a floppy disk, an optical disk, a memory card, a zip disk, a magnetic tape, etc. The volatile read-and-write memory may include a random access memory (RAM). The RAM may include a dynamic RAM (DRAM), a double date rate synchronous dynamic RAM (DDR SDRAM), a static RAM (SRAM), a thyristor RAM (T-RAM), and a zero-capacitor RAM (Z-RAM), etc. The ROM may include a mask ROM (MROM), a programmable ROM (PROM), an erasable programmable ROM (EPROM), an electrically erasable programmable ROM (EEPROM), a compact disk ROM (CD-ROM), and a digital versatile disk ROM, etc. In some embodiments, the storage 220 may store one or more programs and/or instructions to perform exemplary methods described in the present disclosure. For example, the storage 220 may store a program for the processing device 140 for determining a regularization item.

The I/O 230 may input and/or output signals, data, information, etc. In some embodiments, the I/O 230 may enable a user interaction with the processing device 140. In some embodiments, the I/O 230 may include an input device and an output device. Examples of the input device may include a keyboard, a mouse, a touch screen, a microphone, or the like, or a combination thereof. Examples of the output device may include a display device, a loudspeaker, a printer, a projector, or the like, or a combination thereof. Examples of the display device may include a liquid crystal display (LCD), a light-emitting diode (LED)-based display, a flat panel display, a curved screen, a television device, a cathode ray tube (CRT), a touch screen, or the like, or a combination thereof.

The communication port 240 may be connected to a network (e.g., the network 120) to facilitate data communications. The communication port 240 may establish connections between the processing device 140 and the scanner 110, the terminal 130, and/or the storage device 150. The connection may be a wired connection, a wireless connection, any other communication connection that can enable data transmission and/or reception, and/or any combination of these connections. The wired connection may include, for example, an electrical cable, an optical cable, a telephone wire, or the like, or any combination thereof. The wireless connection may include, for example, a Bluetooth™ link, a Wi-Fi™ link, a WiMax™ link, a WLAN link, a ZigBee link, a mobile network link (e.g., 3G, 4G, 5G), or the like, or a combination thereof. In some embodiments, the communication port 240 may be and/or include a standardized communication port, such as RS232, RS485, etc. In some embodiments, the communication port 240 may be a specially designed communication port. For example, the communication port 240 may be designed in accordance with the digital imaging and communications in medicine (DICOM) protocol.

Figure 3:
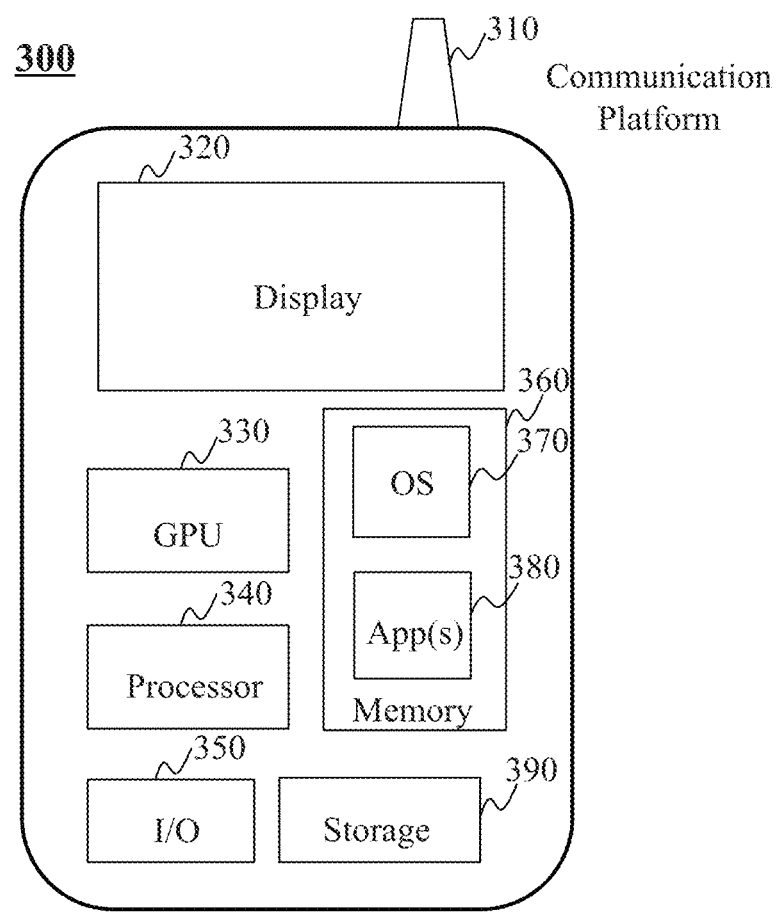
FIG. 3 is a schematic diagram illustrating exemplary components of an exemplary mobile device according to some embodiments of the present disclosure.

FIG. 3 is a schematic diagram illustrating exemplary components of an exemplary mobile device according to some embodiments of the present disclosure. As illustrated in FIG. 3, the mobile device 300 may include a communication platform 310, a display 320, a graphic processing unit (GPU) 330, a processor 340, an I/O 350, a memory 360, and storage 390. In some embodiments, any other suitable component, including but not limited to a system bus or a controller (not shown), may also be included in the mobile device 300. In some embodiments, a mobile operating system 370 (e.g., iOS™, Android™, Windows Phone™) and one or more applications 380 may be loaded into the memory 360 from the storage 390 in order to be executed by the processor 340. The applications 380 may include a browser or any other suitable mobile applications for receiving and/or presenting information relating to the data acquisition, data processing, and image generation from the processing device 140. The application 380 may also include one or more mobile apps for generating control signals for controlling the processing device 140 to perform one or more process relating to the data acquisition, data processing, and image generation. User interactions with the information stream may be achieved via the I/O 350 and provided to the processing device 140 and/or other components of the imaging system 100 via the network 120.

To implement various modules, units, and their functionalities described in the present disclosure, computer hardware platforms may be used as the hardware platform(s) for one or more of the elements described herein. A computer with user interface elements may be used to implement a personal computer (PC) or any other type of work station or terminal device. A computer may also act as a server if appropriately programmed.

Figure 4:
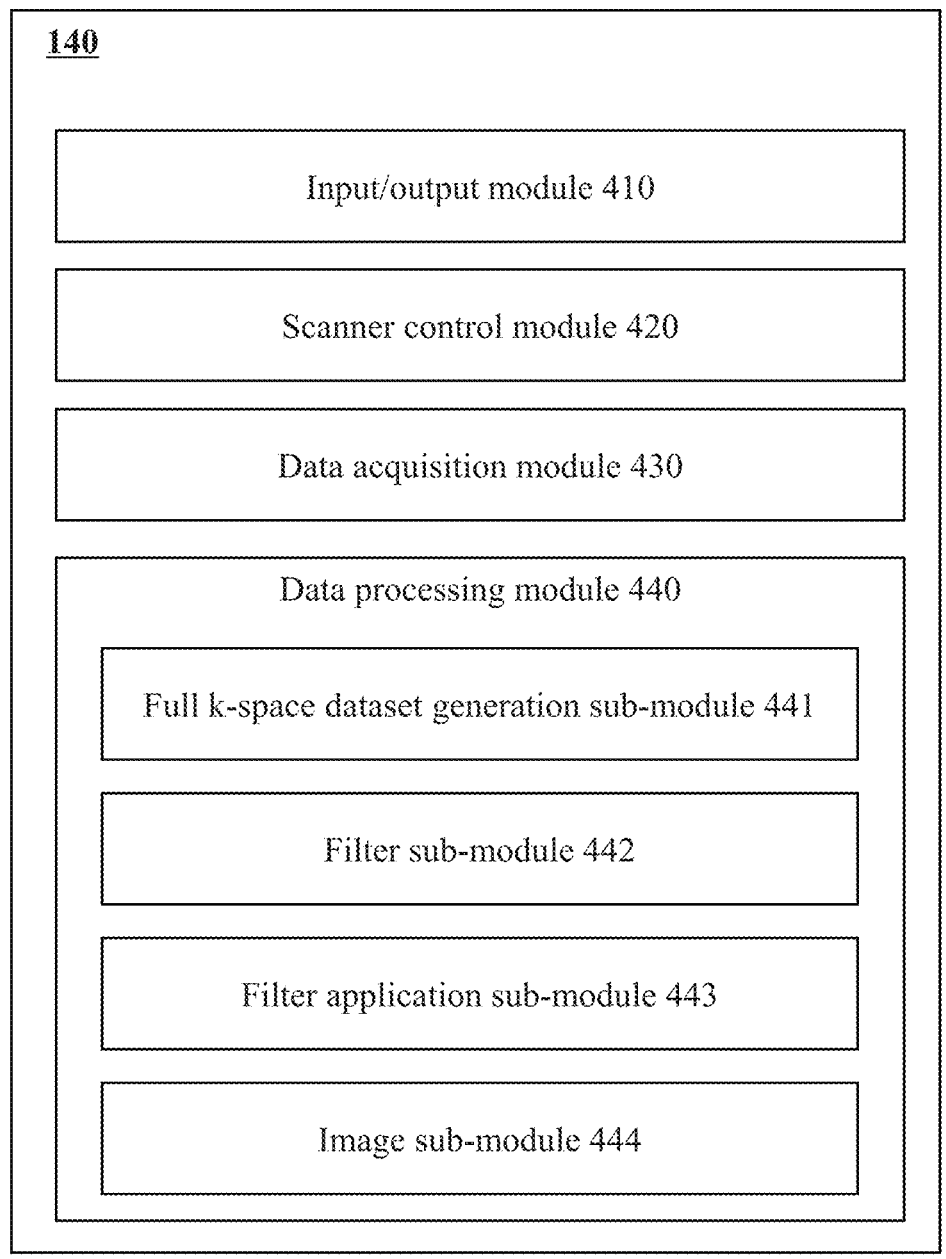
FIG. 4 is a schematic diagram illustrating an exemplary processing device according to some embodiments of the present disclosure.

FIG. 4 is a schematic diagram illustrating an exemplary processing device according to some embodiments of the present disclosure. The processing device 140 may include an input/output module 410, a scanner control module 420, a data acquisition module 430, a data processing module 440, and an image module 450. Other modules may also be included in the processing device 140.

The input/output module 410 may be configured to communicate (e.g., acquire, receive, send) data that may be used or generated by one or more other modules of the processing device 140. The data may include data (e.g., the scan data) generated by the scanner 110, temporary data generated by the processing device 140, a control signal generated by the processing device 140 for controlling the MRI scanner 110, instructions for operating processing device 140 and/or its modules/units, etc. Data communication may be performed with the MRI scanner 110, the terminal 130, an external device, etc.

The scanner control module 420 may be configured to generate control signals for controlling the MRI scanner 110. A control signal may be generated based on one or more scan parameters defining the manner in which a scan is to be performed by the MRI scanner 110. The scan parameters may relate to a scan mode, a scan time, a scan speed, a region to be scanned, a scan condition, etc. The generated control signal may be sent to the MRI scanner 110 via, e.g., the input/output module 410 to control or guide the MRI scanner 110 performing a scanning on a subject.

One or more of the scan parameters may be inputted by a user through the terminal 130, be acquired from a source via the network 120, be acquired from a storage device (e.g., the storage device 150, the storage 220, the memory 260), or the like, or a combination thereof. One or more of the scan parameters may also be determined by one or more modules units of the processing device 140 (e.g., the data acquisition module 430).

The data acquisition module 430 may be configured to acquire scan data from the MRI scanner 110 during a scanning. The data acquisition module 430 may sample the magnetic resonance signals (MR signals) or scan data into a plurality of k-space datasets using one or more MR data sampling techniques. Exemplary sampling techniques may include a Nyquist frequency sampling technique, a partially parallel acquisition (PPA) technique, a compressed sensing (CS) technique, or the like, or a combination thereof. Based on the sampling technique adopted by the data acquisition module 430, the data acquisition module 430 may be configured to sample the scan data using various view orders, sampling trajectories, and sampling patterns. The obtained k-space dataset(s) may be fully-sampled or under-sampled.

K-space datasets related to a same scanning may be of a same size. In the present disclosure, unless otherwise noted, the phrase "a plurality of k-space datasets" or similar phrases such as "the plurality of k-space datasets" and "a plurality of first k-space datasets" may generally indicate that the k-space datasets are related to a same scanning.

Figure 6:
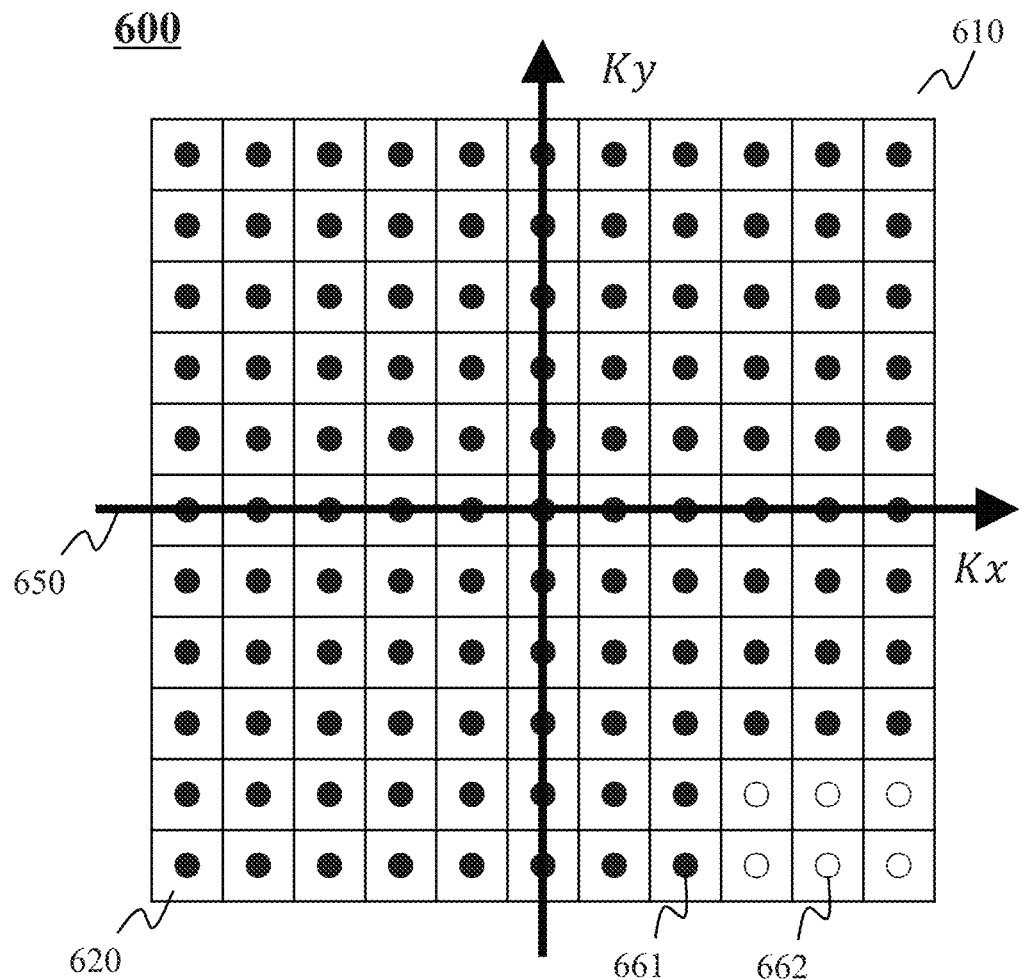
FIG. 6 is a schematic diagram illustrating an exemplary 2D k-space dataset.

More descriptions of a k-space dataset and sampling of the scan data are provided elsewhere in the present disclosure (e.g., in connection with FIG. 6).

The data acquisition module 430 may generate one or more scan parameters for controlling the scan pattern of the MRI scanner 110 to implement the adopted sampling technique. For example, the one or more scan parameters may be generated according to one or more functions, look-up tables, or the like, or a combination thereof. The generated scan parameters may be sent to the scanner control module 420 for generating corresponding control signals.

The data processing module 440 may process the plurality of k-space datasets obtained by the data acquisition module 430 and generate an image thereof. The plurality of k-space datasets may be fully-sampled or under-sampled k-space datasets obtained by the data acquisition module 430. In some embodiments, the data processing module 440 may include a full k-space dataset generation sub-module 410 for generating one or more full k-space datasets based on a plurality of under-sampled k-space datasets obtained by the data acquisition module 430.

In the present disclosure, the data processing module 440 may process a plurality of k-space datasets using a technique termed as "self-consistent filtering technique." The self-consistent filtering technique may be used to process a plurality of k-space datasets related to a scanning of a subject performed by the MRI scanner 110 in order to enhance the SNR of the MRI image or MRS image of the scanned subject. According to the self-consistent filtering technique, a filter may be obtained and used to process the k-space datasets convolutionally. Detailed descriptions of the self-consistent filtering method and the filter obtaining method are provided elsewhere in the present disclosure (e.g., in connection with FIG. 7).

The data processing module 440 may include a filter sub-module 442 for obtaining the filter and a filter application sub-module 443 for applying the filter on a plurality of k-space datasets. The k-space datasets may be fully-sampled k-space datasets obtained by the data acquisition module 430. Alternatively, the k-space datasets may be generated by the data processing module 440 based on under-sampled k-space datasets obtained by the data acquisition module 430. The filter application sub-module 443 may obtain a plurality of processed k-space datasets by applying the filter.

The data processing module 440 may include an image sub-module 444 to generate one or more images (e.g., by Fourier Transform) based on the k-space datasets processed by the data processing module 440 or the filter application sub-module 443. The data processing module 440 may further include functions for processing the generated image(s), such as cropping, rotating, scaling, bright/contrast/color adjusting, or the like. In some embodiments, the image sub-module 444 may generate an intermediate image for each of the processed k-space datasets generated by the filter application sub-module 443 and generate a final image based on the intermediate images.

It should be noted that the above description about processing device 140 is only for illustration purposes, and is not intended to limit the present disclosure. It is understandable that, after learning the major concept and the mechanism of the present disclosure, a person of ordinary skill in the art may alter processing device 140 in an uncreative manner. The alteration may include combining and/or splitting modules or sub-modules, adding or removing optional modules or sub-modules, etc. All such modifications are within the protection scope of the present disclosure.

Figure 5:
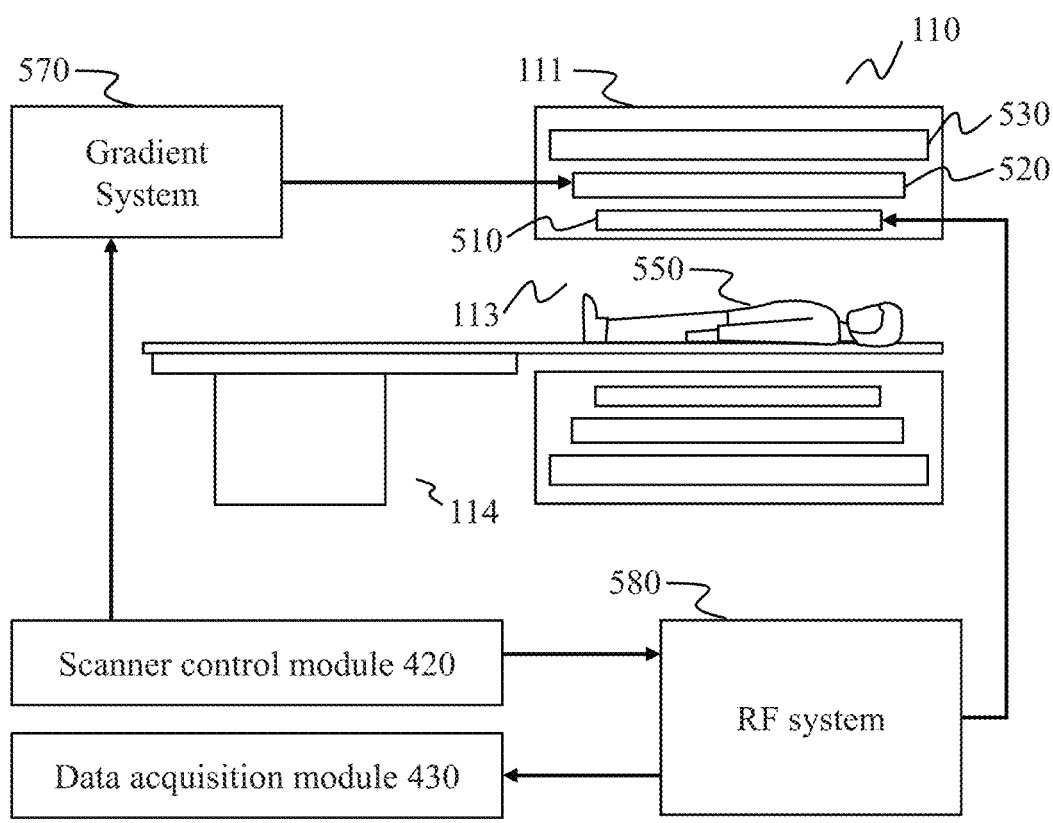
FIG. 5 is a schematic diagram illustrating an exemplary setup for data acquisition using an MRI scanner according to some embodiments of the present disclosure.

FIG. 5 is a schematic diagram illustrating an exemplary setup for data acquisition using an MRI scanner according to some embodiments of the present disclosure.

A schematic of the MRI scanner 110 is illustrated in the FIG. 5. The gantry 111 of the MRI scanner 110 may include a magnet assembly 530, a gradient coil assembly 520, and an RF coil assembly 510.

The magnetic assembly 530 may generate a magnetic field for polarizing a subject 550 to be scanned. The magnetic assembly 530 may include a permanent magnet, a resistive electromagnet, and/or a superconducting electromagnet. In some embodiments, the magnetic assembly 530 may further include shim coils (not shown in FIG. 5) for enhancing the homogeneity of the magnetic field.

The RF coil assembly 510 may generate RF pulses and receive MR signals responding to the RF pulses. The RF coil assembly 510 may include a whole-body RF coil and/or a plurality of parallel coils (not shown in FIG. 5). The whole-body RF coil and/or the plurality of parallel coils may be configured for both generating RF pulse generating and receiving MR signals, or for generating-only or receiving-only.

The gradient coil assembly 520 may generate magnetic field gradient pulses. The magnetic field gradient pulses may be in the X direction ($G_X$), the Y direction ($G_Y$), and/or the Z direction ($G_Z$). Merely by way of example, the Y direction is chosen as the phase encoding direction, while the X direction is chosen as the frequency encoding direction. Correspondingly, $G_Y$ may be used for phase encoding and may generally be referred to as the phase encoding gradient. $G_X$ may be used for frequency encoding or signal readout and may generally be referred to as the frequency encoding gradient or readout gradient. $G_Z$ may be used for slice selection for obtaining two-dimensional (2D) k-space dataset(s), or also be used for phase encoding for obtaining three-dimensional (3D) k-space dataset(s). The magnetic field gradient pulses may determine the manner in which the data is sampled into a k-space dataset.

For demonstration purposes, the present disclosure is described herein by way of example with reference to a 2D k-space dataset. However, it is understood that the principle of the present disclosure may be applied to k-space dataset of higher dimensions (e.g., 3D k-space dataset) as well. It may also be noted that, alternatively, the X direction may be chosen as the phase encoding direction while the Y direction may be chosen as the frequency encoding direction. In this case, the roles of $G_Y$ and $G_X$ may also be switched correspondingly.

The imaging system 100 may further include a gradient system 570 and an RF system 580. The gradient system 570 may generate signals causing the gradient coil assembly 520 to generate magnetic field gradient pulses. The RF system 580 may generate signals causing the RF coil assembly 510 to generate RF pulses. In some embodiments, at least one of the gradient system 570 and/or RF system 580 may be integrated into the MRI scanner 110. In some embodiments, the gradient system 570 and/or RF system 580 may also be individual devices independent of the MRI scanner 110.

To perform a scanning on a subject 550 (e.g., a patient), the table 114 may move the subject 550 into the detection region 113. The data acquisition module 430 of the processing device 140 may generate scan parameters based on the MR data sampling technique adopted. For example, the data acquisition module 430 may retrieve a look-up table or a function relating to the adopted MR data sampling technique from a storage device (e.g., the storage device 150, the storage 220, the memory 360, the storage 390, an external storage accessible by the imaging system 100 via, e.g., the network 120), retrieve scan parameters from the look-up table, and send the retrieved scan parameters or scan parameters generated based on the retrieved scan parameters (e.g., generated by way of extrapolation, interpolation) to the scanner control module 420.

The scanner control module 420 may generate control signals according to the scan parameters from the data acquisition module 430. The control signals may include gradient control signals and RF control signals. The gradient control signals and RF control signals may be sent to the gradient system 570 and RF system 580, respectively.

The gradient system 570 may generate signals causing the gradient coil assembly 520 to generate magnetic field gradient pulses according to the gradient control signals. The RF system 580 may generate signals causing the RF coil assembly 510 to generate RF pulses according to the RF control signals. The sequence, types, emitting time points, duration times, etc., of the gradient pulses and RF pulses may define the manner in which a scan is performed by the MRI scanner 110 according to the MR data sampling technique adopted.

In response to the magnetic field, gradient pulses and RF pulses, atoms (e.g., 1H, 13C, 31P, 15N, 19F, 23Na, 3He) of or within the scan region of the subject 550 may generate MR signals. The MR signals may be received by the RF coil assembly 510 and transmitted to the RF system 580. The RF system 580 may obtain the MR signals received by the RF coil assembly 510 and convert (e.g., by an A/D convert) the received MR signals into scan data. The conversion of the MR signals may further include amplification, demodulation, filtration, etc. The scan data may be acquired by the data acquisition module 430 and sampled into one or more k-space datasets.

The RF coil assembly 510 may include a plurality of parallel coils for receiving the MR signals. The data acquisition module 430 may obtain a k-space dataset based on MR signals received by each of the plurality of parallel coils. The obtained k-space datasets may be fully-sampled or under-sampled. The obtained k-space datasets may be further processed by one or more modules of processing device 140 (e.g., data processing module 440) to generate an image of the subject 550. The image (e.g., MRI image) may include information relative to the internal structure of the scanned region of the subject 550. Alternatively or additionally, the image (e.g., an MRS image) may include bio-chemical information relating to the type and/or abundance of one or more elements (e.g., 1H, 15N, 31P, 23Na) of a plurality of locations in the scanned region of the subject 550. For example, an MRS image may include a distribution of chemical shifts and abundance of one or more certain elements (e.g., 1H, 31P, or any other target elements) on a region of interest (e.g., brain). Based on the chemical shifts, one or more metabolites (e.g., glutamate, gultanine, choline, creatine, N-acetylasparatate) may be identified and their amounts may also be estimated accordingly. Such information may be used for analyzing metabolic processes in the region of interest.

FIG. 6 is a schematic diagram illustrating an exemplary 2D k-space dataset. A k-space dataset 600 is illustrated on a 2D Cartesian grid 610. The Cartesian grid 610 is a data structure for the data of the k-space dataset 600. The Cartesian grid 610 may be viewed as including a plurality of cells (e.g., cell 620) arranged in a plurality of rows and columns. The cells may hold scan data sampled from the MRI scanner 110 or data obtained (e.g., by reconstruction) from the sampled scan data. The data within a cell may be referred to as a data point (or pixel). The sampled scan data within a cell may be referred to as a sampled data point. A data point generated based on the sampled scan data within a cell may be referred to as a reconstructed data point. Even without holding a sampled data point or a reconstructed data point, a cell of the Cartesian grid 610 may be assigned a value (e.g., zero or a random value). A cell with such an assigned value may be referred to as a blank cell; such an assigned value may be referred to as an unsampled data point.

Sampled data points and/or reconstructed data points may be illustrated as black circles (e.g., black circle 661) in the figures (e.g., FIG. 6) of the present disclosure. Unsampled data points may be illustrated as open circles (e.g., open circle 662) in the figures (e.g., FIG. 6) of the present disclosure. The process for filling a sampled data point or reconstructed data point into a blank cell (e.g., replacing an assigned data point of a blank cell with a sampled data point or a data point generated based on sampled data) may be referred to as filling a cell or filling a k-space dataset. For instance, a k-space dataset may initially include cells with arbitrarily assigned initial values (e.g., zero, a random value); the k-space dataset may be at least partially filled with sampled data points and/or reconstructed data points.

The data acquisition module 430 may obtain the k-space dataset 600 by filling the Cartesian grid 610 with sampled scan data. The size of the Cartesian grid 610 of the k-space dataset 600 may be set by the data acquisition module 430. The Cartesian grid 610 may be configured to have a proper size in order to reduce artifacts. For instance, the Cartesian grid 610 may be set with a sufficient number of rows such that the data acquisition module 430 may need to sample the MR signals or scan data at a frequency larger than or equal to the Nyquist frequency in the phase encoding direction $K_y$, to fill all the rows of the Cartesian grid 610. The number of the columns of the Cartesian grid 610 may be set equal to or larger than the number of the rows.

The size of a k-space dataset 600 may generally refer to the size of the Cartesian grid 610, which may be represented by width×height. The width may refer to the number of columns of the Cartesian grid 610. The height may refer to the number of rows of the Cartesian grid 610. The size of the k-space dataset 600 may be, for example, 255×255, or any other proper size. For demonstration purposes and simplicity, an 11×11 Cartesian grid 610/k-space dataset 600 is illustrated in FIG. 6, which is not intended to be limiting.

A k-space dataset (or a region thereof) with all the cells of the corresponding Cartesian grid filled with sampled scan data points or reconstructed data points may be referred to as a full k-space dataset (or the entire region). A k-space dataset (or a region thereof) with the corresponding Cartesian grid having one or more blank cells may be referred to as a reduced k-space dataset (or a reduced region). The blank cells of the reduced k-space dataset may be padded with zeroes or left unprocessed when the data acquisition is finished. The zero padding is not considered as filling a cell in the present disclosure.

The k-space dataset 600 may use a Cartesian coordinate system 650 as illustrated in FIG. 6. $K_x$ refers to the direction of frequency encoding. $K_y$ refers to the direction of phase encoding. The origin of the Cartesian coordinate system 650 may correspond to a center cell of the k-space dataset 600. A region of the k-space dataset 600 in the vicinity of the origin of the Cartesian coordinate system 650 may be referred to as a central region. Regions other than the central region may be referred to as surrounding regions. The central region may cross the whole Cartesian grid or just occupy a part along the $K_x$ direction and/or $K_y$ direction. The central region may be arbitrarily defined based on the sampling technique used.

The k-space dataset 600 may relate to a slice of the scan subject (e.g., subject 550). The filling process may be briefly described as follows. First, a certain slice may be determined or chosen by applying a certain $G_z$. After that, though phase encoding and frequency encoding, cells of the Cartesian grid 610 may be filled with sampled scan data. For instance, a certain combination of $G_y$, $G_x$, and an MR signal sampling time (or a signal readout time) may locate a certain cell of the Cartesian grid 610. The readout MR signal may be digitalized (to generate scan data) and stored in the determined cell to complete one sampling cycle. The sampling cycle may be performed in a manner as described in FIG. 5. The sampling cycle may be performed for a plurality of times to fill a plurality of cells of the Cartesian grid 610.

Not all the cells of the Cartesian grid 610 are required to be filled during the data acquisition process. A k-space dataset (or a region thereof) with all the cells of the corresponding Cartesian grid filled with sampled scan data points may be referred to as a fully-sampled k-space dataset (or a fully-sampled region). A k-space dataset (or a region thereof) with the corresponding Cartesian grid having one or more cells not filled with sampled scan data may be referred to as an under-sampled k-space dataset (or an under-sampled region).

If all the cells of the Cartesian grid 610 are filled with sampled scan data during the data acquisition process, the k-space dataset 600 may be referred to as a fully-sampled k-space dataset (which may also be a full k-space dataset). If one or more cells of the Cartesian grid 610 are not filled with sampled scan data during the data acquisition process, the k-space dataset 600 may be referred to as an under-sampled k-space dataset (which may also be a reduced k-space dataset).

Figure 8:
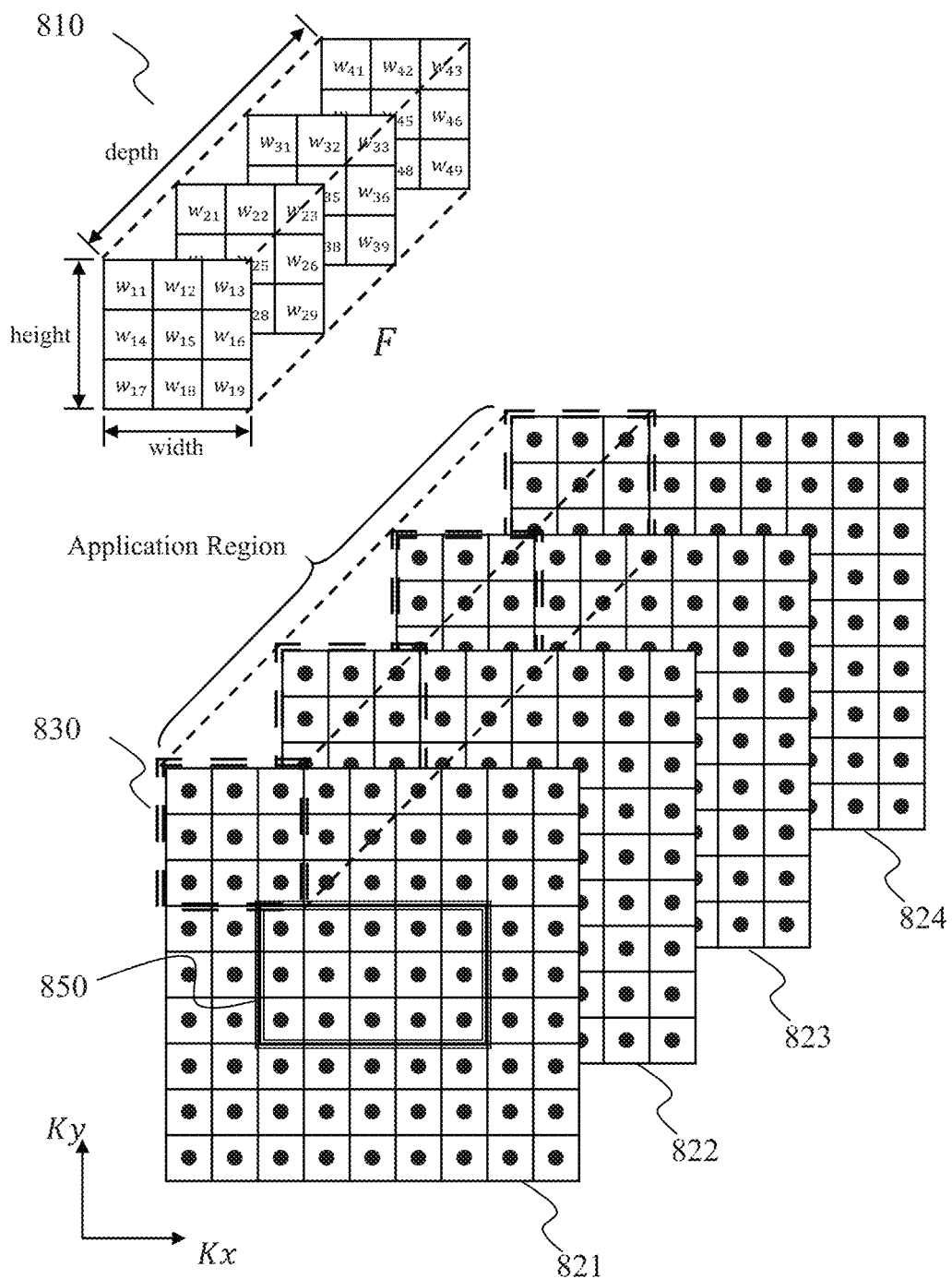
FIG. 8 is a schematic diagram illustrating an exemplary filter for processing a plurality of k-space datasets according to some embodiments of the present disclosure.

In some embodiments, the data acquisition module 430 may obtain a plurality of under-sampled k-space datasets. The under-sampled k-space datasets may include one or more fully-sampled regions dispersed in the under-sampled k-space dataset. A fully-sampled region may be substantially the central region of the under-sampled k-space dataset. In some embodiments, a fully-sampled region may extend through the plurality of under-sampled k-space datasets. That is, the corresponding region of each of the plurality of k-space datasets is fully-sampled. As used herein, a region in a first k-space dataset may be regarded as corresponding to a region in a second k-space dataset if both of the regions cover the same cells (e.g., cells with the same coordinates) in the grades. The fully-sampled region may be designated as a calibration region for generating a kernel or filter for filling or processing the plurality of k-space datasets, including the at least one under-sampled k-space dataset. The description of the term "extending through" is illustrated in FIG. 8.

The data acquisition module 430 may adopt one or more sampling techniques (e.g., PPA, CS) to generate under-sampled k-space datasets for reducing the scan time of the MRI scanner 110. For example, the data acquisition module 430 may use a plurality of parallel coils to receive MR signals related to a scan and generate a plurality of under-sampled k-space datasets therefrom. The number of the coils may be 2, 4, 8, 32, etc. One or more k-space datasets for image generation may be determined based on the plurality of under-sampled k-space datasets, e.g., by the full k-space dataset generation sub-module 441.

The data acquisition module 430 may fill the cells of the Cartesian grid 610 using different sequences. The data acquisition module 430 may be configured to fill the cells of the Cartesian grid 610 in various view orders (filling sequence), such as sequential view order (e.g., row by row from the bottom to the top of the Cartesian grid 610), centric view order (e.g., first the cells of the central region, and then the cells of the surrounding regions), or other view orders that may improve the SNR or other image quality parameters of the image generated from the k-space dataset 600.

The data acquisition module 430 may be configured to sample the scan data along one or more sampling trajectories. The sampling trajectories may be a plurality of parallel straight lines (e.g., spin-wrap), a plurality of radial straight lines, one or more spiral lines, one or more random lines (straight and/or curved), or the like, or a combination thereof. The data acquisition module 430 may also sample scan data randomly (e.g., CS) or based on regions. Exemplary sampling trajectories are illustrated in FIGS. 12-A to 15.

The scan data sampled with a Cartesian sampled pattern (e.g., the sampling trajectories are straight lines along the rows or columns of the Cartesian grid 610, or the sampled scan data corresponding to the cells of the Cartesian grid 610) may be directly filled into the cells of the Cartesian grid 610. However, the scan data sampled with a non-Cartesian sampled pattern (e.g., the sampling trajectories are curved or radial, or the sampled scan data lacks direct correspondence to the cells (or the center of cells) of the Cartesian grid 610) may need to be processed before they are filled into the Cartesian grid 610. A gridding operation may be performed by the data acquisition module 430 to generate data points to fill the Cartesian grid 610. The gridding may be based on, e.g., interpolation, extrapolation. In some embodiments, a gridding kernel may be obtained for the gridding operation. The data points generated via the gridding operation may also be considered as the sampled scan data in the present disclosure.

The data acquisition module 430 may be configured to perform a scan on a subject or sample the MR signals or scan data with a weighting function. The weighting function may cause the data points closer to the center of a k-space dataset (the original of the Cartesian coordinate system 650) being sampled for more times. The weighting function may be continuous or discontinuous. The weighting function may be a single function, a combination of functions, one or more look-up tables, etc. In some embodiments, the weighting function may be a combination of a cosine function and one or more other functions.

In some embodiments, the data acquisition module 430 may use the weighting function to perform a density weighted sampling or acquisition weighed sampling. In some embodiments, the data acquisition module 430 may perform the density weighted sampling or acquisition weighted sampling in combination with a parallel MRI sampling technique (e.g., SMASH, Auto-SMASH, VD-Auto-SMASH, GRAPPA).

After the data acquisition using the weighting function, a data point may be determined based on the data points acquired in multiple samplings and be filled into a corresponding cell. For example, the data point may be a mean (weighted or not weighted) of the data points acquired in one or more of the multiple samplings.

Figure 7:
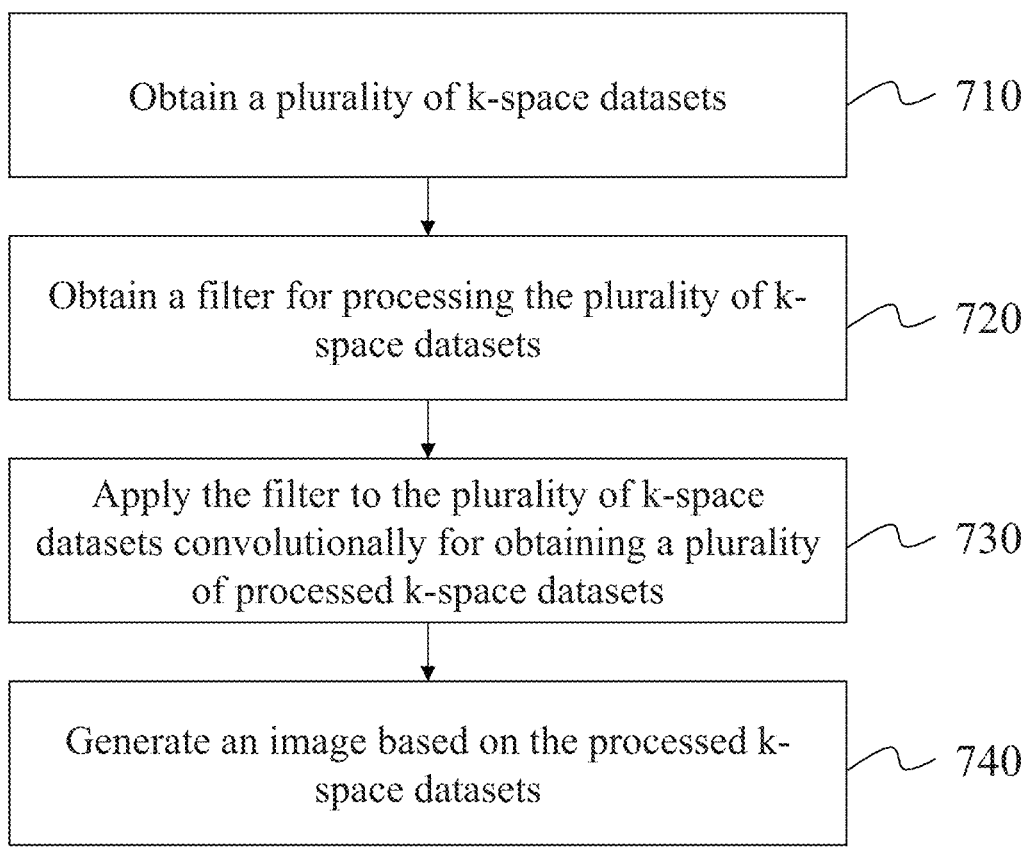
FIG. 7 is a schematic diagram illustrating an exemplary process for processing the k-space datasets according to some embodiments of the present disclosure.

FIG. 7 is a schematic diagram illustrating an exemplary process for processing the k-space datasets according to some embodiments of the present disclosure. Process 700 may be an exemplary process for performing the self-consistent filtering technique to improve the image quality of an MRI image or the accuracy of an MRS image. One or more steps of process 700 may be performed by the data processing module 430 for processing the k-space datasets (fully-sampled or under-sampled) obtained by the data acquisition module 430. In some embodiments, one or more operations of process 700 illustrated in FIG. 7 for processing the k-space datasets may be implemented in the imaging system 100 illustrated in FIG. 1. For example, the process 700 illustrated in FIG. 7 may be stored in the storage device 150 in the form of instructions, and invoked and/or executed by the processing device 140 (e.g., the processor 210 of the computing device 200 as illustrated in FIG. 2).

In 710, the data processing module 430 may obtain a plurality of k-space datasets. The plurality of k-space datasets may be fully-sampled k-space datasets or under-sampled k-space datasets obtained by the data acquisition module 430. Alternatively, the plurality of k-space datasets may be full. As another example, the plurality of k-space datasets may be full k-space datasets obtained by filling under-sampled datasets (e.g., using PPA related reconstruction techniques or CS related sampling techniques).

In some embodiments, the data processing module 430 may obtain a plurality of fully-sampled k-space datasets. The plurality of coils of the MRI scanner 110 may receive MR signals related to a scanning of a subject performed by the MRI scanner 110. The MR signals received by a coil may represent a fully-sampled k-space dataset. Based on the received MR signals, the data acquisition module 430 may obtain a plurality of fully-sampled k-space datasets, which may then be obtained by the data processing module 430 as the plurality of k-space datasets.

In some embodiments, the data processing module 430 may first obtain a plurality of under-sampled k-space datasets for speeding up the data acquisition operation. The plurality of coils of the MRI scanner 110 may receive MR signals related to a scanning of a subject performed by the MRI scanner 110. The MR signals received by a coil may represent an under-sampled k-space dataset. Based on the received MR signals, the data acquisition module 430 may obtain a plurality of under-sampled k-space datasets. The under-sampled k-space datasets may then be processed by the full k-space dataset generation sub-module 441 to generate a plurality of full k-space datasets as the plurality of k-space datasets. The full k-space dataset generation sub-module 441 may include one or more means to generate the plurality of full k-space datasets based on the under-sampled k-space datasets given the sampling technique adopted by the data acquisition module 430.

In some embodiments, the full k-space dataset generation sub-module 441 may reconstruct unsampled data points based on sampled data points of the under-sampled k-space datasets for filling the blank cells. The reconstruction may be based on extrapolation, interpolation, PPA, CS, or the like, or a combination thereof.

To implement PPA based reconstruction, many techniques well known in the art may be adopted by the full k-space dataset generation sub-module 441, such as sensitivity encoding (SENSE), simultaneous acquisition of spatial harmonics (SMASH), generalized autocalibrating partially parallel acquisitions (GRAPPA), AUTO-SMASH, variable density AUTO-SMASH (VD-AUTO-SMASH), parallel imaging with localized sensitivities (PILS), or the like, or a variant thereof, or a combination thereof.

To implement CS based reconstruction, the scan data may be sampled randomly by the data acquisition module 430. The data acquisition module 430 may adopt one or more functions or look-up tables for sampling scan data to obtain the under-sampled k-space datasets (e.g., sparse k-space datasets) viable for CS reconstruction. In some embodiments, the data acquisition module 430 may adopt non-Cartesian sampling pattern or trajectories to sample scan data, and a gridding operation may be involved to obtain the under-sampled k-space datasets for performing the CS reconstruction. The full k-space dataset generation sub-module 441 may adopt a non-linear reconstruction scheme such as $l^1$ minimization or any other proper algorithms to perform the CS reconstruction.

In some embodiments, the full k-space dataset generation sub-module 441 may use at least some of sampled data points related to another scanning (first scanning) and at least some of sampled data points related to the current scanning (second scanning) to obtain a full k-space dataset. The first scanning may be performed before or after the second scanning by the same MRI scanner 110 upon a same scan region of a subject. For a coil of the MRI scanner 110, a first k-space dataset (fully-sampled or under-sampled) may be obtained during the first scanning, a second k-space dataset (under-sampled) may be obtained during the second scanning, and the first k-space dataset may include sampled data points corresponding to the unsampled data points of the second k-space dataset. The blank cells of the second k-space dataset may be filled with the corresponding sampled data points of the first k-space dataset. For example, a second k-space dataset may include sampled data points at a central region, and a first k-space dataset may include sampled data points at surrounding regions relative to the central region. A surrounding region and the central region may be complementary, or at least partially overlap. Combining the sampled data points of the second k-space dataset and the corresponding first k-space dataset may generate a full k-space dataset.

In some embodiments, the full k-space dataset generation sub-module 441 may obtain the plurality of k-space datasets by filling blank cells of under-sampled k-space datasets with reconstructed data points using different reconstruction techniques. For example, blank cells of central regions of the under-sampled k-space datasets may be filled with reconstructed data points reconstructed using a PPA technique, and blank cells of surrounding regions of the under-sampled k-space datasets may be filled with reconstructed data points reconstructed by way of interpolation or extrapolation based techniques.

In some embodiments, the data processing module 430 may obtain a plurality of under-sampled k-space datasets as the plurality of k-space datasets. The plurality of under-sampled k-space datasets may be obtained by the data acquisition module 430 and may include a fully-sampled region and an under-sampled region, each of which may extend through the plurality of under-sampled k-space datasets. The fully-sample region may be a central region, and the under-sampled region may be a surrounding region.

In some embodiments, a weighting function may be involved in obtaining the under-sampled k-space datasets. Exemplary processes are discussed in connection with FIGS. 17 and 18.

In some embodiments, the filter used for self-consistent filtering may also be used for reconstructing unsampled data points for filling the blank cells of the obtained under-sampled k-space datasets. An exemplary process is discussed in connection with FIG. 19.

In 720, the filter sub-module 442 may obtain at least one filter for processing the plurality of k-space datasets obtained in 710. The at least one filter (e.g., filter 810 as illustrated in FIG. 8) may be a 3D matrix including a plurality of weighting factors (e.g., $w_{11}$ to $w_{49}$ as illustrated in FIG. 8). The 3D matrix may also be viewed as a stack of 2D matrices of the same size. The at least one filter may be generated prior to or during 720. For instance, the at least one filter may be generated offline by, e.g., a manufacture of the MRI scanner 110, a third-party, etc., and store in a storage device (e.g., the storage device 150, the storage 220, the memory 360, the storage 390, an external storage accessible by the imaging system 100 via, e.g., the network 120, etc.)

The size of a filter (or the 3D matrix) may be represented as width×height×depth. The width may refer to the number of the columns (or referred to as the column count) of any one of the 2D matrices of the 3D matrix. The height may refer to the number of the rows (or referred to as the row count) of any one of the 2D matrices of the 3D matrix. The size of a 2D matrix (width×height) of the filter may be 3×3, 4×4, 5×5, 6×6, 9×9, 3×4, a size adaptively obtained based on the size of the obtained k-space datasets, a size determined based on the sampling technique adopted by the data acquisition module 430, or any other proper size. The depth of the 3D matrix may refer to the number of layers (or referred to as the layer count) of the 2D matrices of the 3D matrix, which may be set with the number of the plurality of k-space datasets obtained in 710, or the number of the coils of the MRI scanner 110. For demonstration purposes, a 3×3×4 filter is referred to for describing the self-consistent filtering technique introduced in the present disclosure, which, however, is not intended to be limiting. It may also be noted that the filter with other "shapes" (e.g., by setting weighting factors at certain locations of the 3D matrix as zeroes) may also be adopted by the present disclosure.

The filter may have an application region (e.g., application region 830) on the obtained k-space datasets (e.g., k-space datasets 821 to 824). The application region may refer to a region of the k-space datasets interacting with (e.g., for generating the filter, for processing the k-space datasets) the filter during a corresponding operation. The application region may also be referred to as a receptive field. The application region may extend through all the k-space datasets acquired in 710. The application region and the filter may have a correspondence. For example, the size and "shape" of the application region may be the same as the size and "shape" of the filter, a weighting factor of the filter may correspond to a data point within the application region. By applying the filter to an application region of the k-space datasets, a data point within the application region may be determined based at least on other data points within the application region. The newly determined data point may be used to modify or replace the original data point. The original data point as used herein may refer to a sampled data point or a reconstructed data point. In some embodiments, all the data points within the application region may be used to determine a new data point for modifying or replace an original data point, including the original data point itself. Alternatively, all the data points within the application region may be used to determine a new data point for modifying or replace an original data point except the original data point itself.

In the present disclosure, a region (or application region) extending through a plurality of k-space datasets (e.g., of the same-size) may be referred to a 3D region including a plurality of 2D regions of the same size. A 2D region may be within a k-space dataset of the plurality of k-space datasets, and each 2D region of the 3D region may cover a same coordinate range of the corresponding Cartesian grid. An application region 830 extending through a plurality of k-space datasets (e.g., k-space datasets 821-824) is illustrated in FIG. 8.

In some embodiments, the plurality of k-space datasets obtained in 710 may be full k-space datasets. The filter sub-module 442 may generate the at least one filter based on the full k-space datasets related to the current scanning. The full k-space datasets may be fully-sampled k-space datasets obtained by the data acquisition module 430, or full k-space datasets generated by the full k-space dataset generation sub-module 441 based on under-sampled k-space datasets obtained by the data acquisition module 430, or a combination thereof. The filter sub-module 442 may determine a calibration region (e.g., calibration region 850 as illustrated in FIG. 8) extending through the fully-sampled k-space datasets for generating the filter. The calibration region may be a part of (e.g., a central region) or the whole fully-sampled k-space datasets. The size of the calibration region may be larger than the size of the filter.

Figure 9:
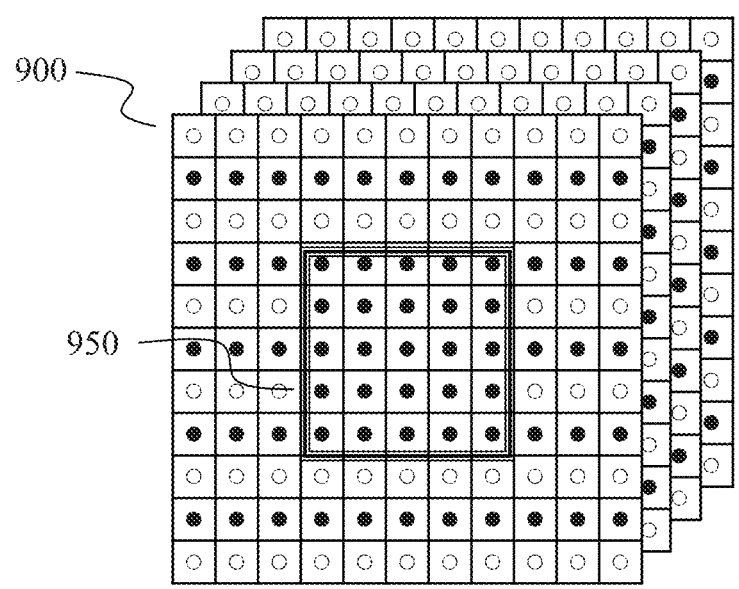
FIG. 9 is a schematic diagram illustrating an exemplary calibration region of a plurality of under-sampled k-space datasets according to some embodiments of the present disclosure.

In some embodiments, the plurality of k-space datasets obtained in 710 may be under-sampled k-space datasets, or initially be under-sampled k-space datasets (e.g., subsequently converted to full k-space datasets by filling under-sampled k-space datasets). The filter sub-module 442 may generate the at least one filter based on the under-sampled k-space datasets (e.g., under-sampled k-space datasets 900 as illustrated in FIG. 9) used for generating the k-space datasets. The filter sub-module 442 may determine a fully-sampled calibration region (e.g., calibration region 950 in FIG. 9) extending through the under-sampled k-space datasets (e.g., obtained using PPA techniques requiring calibration used data points such as SMASH, GRAPPA) for generating the filter. The size of the calibration region may be larger than the size of the filter. It should be noted that, if the filter is pre-determined (e.g., retrieved from a storage device as described elsewhere in the present disclosure) and not generated directly based on the under-sampled k-space datasets, fully-sampled regions may be unnecessary in the under-sampled k-space datasets (e.g., obtained using SENSE based sampling technique).

In some embodiments, the calibration region for generating the at least one filter may also be the region (may also be referred to as the calibration region) for reconstructing unsampled data points in, for example, a PPA technique.

In some embodiments, the generated filter may also be used for reconstructing unsampled data points for filling the under-sampled k-space datasets. For example, the generated filter(s) may first be used to fill the under-sampled k-space datasets, and then be used to modify data points of the filled k-space datasets. An exemplary process is described in connection with FIG. 19.

In some embodiments, the filter sub-module 442 may obtain a pre-stored filter from a storage device (e.g. the storage device 150, the storage 220, the storage 390, the memory 360, an external storage accessible by the imaging system 100 via, e.g., the network 120, etc.). The pre-stored filter may be generated (e.g., by the filter sub-module 442) based on k-space datasets (fully-sampled or under-sampled) related to another scanning performed by the MRI scanner 110.

The data points within the determined calibration region (either from k-space datasets or from under-sampled k-space datasets) may be used to determine the weighting factors of the at least one filter. The size of the calibration region may be pre-determined or optimized by the filter sub-module 442 for better results (e.g., high image quality, processing efficiency, computing load, computational complexity). In some embodiments, the calibration region may cover a central region extending through the plurality of k-space datasets (e.g., calibration region 850 as illustrated in FIG. 8).

An exemplary process for determining the weighting factors are described in connection with FIGS. 10-A and 10-B. However, variants of this process or any other similar processes may be used to determine weighting factors as well.

A filter (e.g., filter 1030 as illustrated in FIG. 10-B) of which the weighting factors are to be determined are denoted as F. The size of F is w×h×d. The ith weighting factors of the jth 2D matrix of F may be denoted as $w_{ij}$. i and j are integers, where $1 \leq j \leq w \times h$ and $1 \leq i \leq d$. The filter F may be generated by the filter sub-module 442. At least some of the weighting factors of F are unknown when is generated.

The filter sub-module 442 may first determine a calibration region (e.g., calibration region 1010 as illustrated in FIG. 10-A, for simplicity, only one of the 2D regions of calibration region 1010 is illustrated). In the determined calibration region, the filter sub-module 442 may then determine an application region (first application region, e.g., application region 1020 as illustrated in FIG. 10-A). The application region may be denoted as K. The ith k-space data point of the jth 2D matrix of K may be denoted as $k_{ij}$. i and j may hold same meanings and ranges given the correspondence between the application region and the filter F. The weighting factor $w_{ij}$ may correspond to the data point $k_{ij}$.

The filter sub-module 442 may obtain a relationship for determining the weighting factors of the filter F. In some embodiments, the relationship may be obtained as a linear function. Merely by way of example, the linear function may be in the form of Equation 1, which may be expressed as:

$$\Sigma_{i,j} k_{ij} w_{ij} = 0. \tag{1}$$

Alternatively, the linear function may be in the form of Equation 2, which may be expressed as:

$$\Sigma_{i,j} k_{ij} w_{ij} = k_{ab}, \tag{2}$$

where a and b are integers, where $1 \leq b \leq w \times h$, and $1 \leq a \leq d$. a and b may be predetermined values, and $k_{ab}$ may be a data point of a certain cell of the application region. For example, $k_{ab}$ may be the data point within one of the center cells (e.g., $k_{15}$), one of the corner cells (e.g., $k_{11}$), or another cell of the application region. In 730, the data point $k_{ab}$, may be the one to be corrected or modified with the filter obtained based on Equation 2.

The determination of weighing factors may then be implemented by solving the unknown values of the obtained linear function. The filter sub-module 442 may obtain additional linear functions using data points within other application regions (e.g., application region 1021 illustrated in FIG. 10-A) determined (by the filter sub-module 442) in the calibration region. One linear function may be obtained for one application region. For solving all the unknown values, a sufficient number (e.g., equal to or larger than the number of unknown weighting factors of the filter) of the application regions may be determined in the calibration region. In some embodiments, the number of the determined application regions may be larger than (e.g., 1.5 times, 2 times, 5 times, 10 times) the number of the weighing factors of the filter F (the size of the calibration region is large enough) for reducing or eliminating the errors, noises, etc.

The filter sub-module 442 may solve the obtained plurality of linear equations to determine the weighting factors of the filter F using one or more algorithms well known in the art. After the weighting factors are determined, the filter F may be applied in 730 for processing the plurality of k-space datasets.

When Equation 1 is used to determine the weighting factors of the filter, one filter may need to be determined in 720 and used throughout 730. However, when Equation 2 is used to determine the weighting factors of the filter, a plurality of filters may need to be determined, one for each of the plurality of k-space datasets (or the receiving coils). For example, the filter sub-module 442 may determine weighting factors of a first filter with $k_{ab}$ set as $k_{1b}$ for the 1st k-space dataset, and determine weighting factors of a second filter with $k_{ab}$ set as $k_{2b}$ for the 2nd k-space dataset, and so on. Each filter may be used to process the corresponding k-space dataset in 730.

In 730, the filter application sub-module 443 may apply the filter (or filters) obtained in 720 (with known weighting factors) to the plurality of k-space datasets convolutionally to obtain a plurality of processed k-space datasets. The filter application sub-module 443 may determine at least one trajectory throughout a predetermined region (the region to be processed with the filter, e.g., the whole k-space datasets, a central region of the k-space datasets) extending through the k-space datasets, and apply the filter on the determined application regions to process (modify or replace) the original data points of the k-space datasets. The predetermined region may be determined by the application sub-module 443, a user of the imaging system 100, or a combination thereof. The predetermined region may be a fully-sampled region, or a full region generated by filling an under-sampled region extending through the plurality of k-space datasets. The filter application sub-module 443 may convolve the filter along the at least one trajectory for processing the k-space datasets, which may be found below in connection with FIGS. 11-A and 11-B.

The filter application sub-module 443 may determine a first application region (e.g., application region 1110 as illustrated in FIG. 11-A) along the at least one trajectory (e.g., the arrow illustrated in FIGS. 11-A and 11-B) on the predetermined region (e.g., region 1100 as illustrated in FIG. 11-A) of the plurality of k-space datasets and apply the filter F obtained in 720 (filter 1030 as illustrated in FIG. 10-B) to the first application region. The at least one trajectory may represent a sequence and location for applying the filter F. For example, in an exemplary processing the k-space datasets with the filter F, the filter F may be first applied to a region having a center at coordinate (0, n), then a region having a center at coordinate (1, n), next a region having a center at coordinate (2, n), and so on, until a region having a center at coordinate (m, n) is reached. This processing manner may be described as applying the filter F along a trajectory ($K_y$=n; $0 \leq Kx \leq m$), with a stride as 1.

By applying the filter F, a relationship may be built. In some embodiments, the relationship may be built as a linear function. When the weighting factors of filter F is determined according to Equation 1, the linear function may be in the form of Equation 3, which may be expressed as:

$$\Sigma_{i,j} k_{ij} w_{ij} = 0. \quad (3)$$

All the symbols of Equation 3 hold the same meaning as in Equation 1. The weighting factors of the filter F have been determined in 720. The k-space data points within the first application region may also be known values. However, the data point to be modified or replaced (processed data point, e.g., data point 1111 as illustrated in FIG. 11-A) may be treated as an unsampled data point (or unknown value) in Equation 3. By solving Equation 3, the filter applying sub-module 443 may determine a new value for the processed data point and use the new value to modify or replace the processed data point. In Equation 3, the processed data point may be viewed as determined based on all the other data points within the first application region.

It may be noted that, although in FIG. 11-A the central data point of the first application region is illustrated as the processed data point, the filter application sub-module 443 may set any one of the data points within the first application region to be the processed data point.

Alternatively, when the weighting factors of filter F is determined according to Equation 2, the linear function may be in the form of Equation 4, which may be expressed as:

$$\Sigma_{i,j} k_{ij} w_{ij} = k_{ab}. \quad (4)$$

All the symbols of Equation 4 also hold the same meaning as in Equation 2. The data point represented by $k_{ab}$ may be set as the processed data point. The data point represented by $k_{ab}$ may be treated as a known data point (or known value) in the left part of Equation 4 (when solving $\Sigma_{i,j} k_{ij} w_{ij}$) and be treated as an unsampled data point (or unknown value) in the right part of Equation 4. Alternatively, the data point represented by $k_{ab}$ may be treated as an unsampled data point in both the left part and the right part of Equation 4. By solving Equation 4, the filter application sub-module 443 may determine a new value for the processed data point and use the new value to modify or replace the processed data point. In Equation 4, the processed data point may be viewed as being determined based on all the data points (including the processed data point itself) within the first application region.

In some embodiments, after the processed data point is modified or replaced, the filter application sub-module 443 may determine a second application region (e.g., application region 1120 as illustrated in FIG. 11-B) along the at least one trajectory to determine a second processed data point (e.g., data point 1121). The second processed data point may have a same relative position (center, corner, etc.) or coordinate in the second application region as the relative position of coordinate of the first processed data point in the first application region. If one or more prior determined data points (e.g., the first processed data point 1111) are included in the second application region, the prior determined data points may also be involved in the determining of the second processed data point (e.g., using Equation 3 or 4). By repeating the determination of the application region and the applying of the filter, the filter application sub-module 443 may convolve the filter across a first 2D region of the predetermined region. Then the filter application sub-module 443 may convolve the filter across a second 2D region of the predetermined region, and so on, until the whole predetermined region is processed.

Alternatively, after the processed data point is modified or replaced, the filter application sub-module 443 may convolve the filter through the depth of the first application region. For example, at the first application region, the filter application sub-module 443 may first determine data point $k_{1b}$ of a first 2D region of the first application region on a first k-space dataset, then determine data point $k_{2b}$ of a second 2D region of the first application region on a second k-space dataset, and so on. Data point $k_{1b}$ and data point $k_{2b}$ may locate at a same position of the first application region but with different depths, e.g., $k_{15}$ and $k_{25}$ as illustrated in FIG. 10-B). For determining data point $k_{2b}$, the prior determined data point $k_{1b}$ as well as any other prior determined data points within the first application region may also be involved. After the filter being convolved through the depth of the first application region, the filter application sub-module 443 may determine a second application region and convolve the filter through the depth of the second application region. The filter application sub-module 443 may then determine a third application region, and so on, until the whole predetermined region is processed.

The filter obtained based on Equation 1 may be used throughout 730. The filter application sub-module 443 may process a data point at a 2D region of the application region by treating the processed data point as an unsampled data point in Equation 3. However, as mentioned in the description of 720, a plurality of filters obtained based on Equation 2 may be used in 730. The filter application sub-module 443 may process a data point at a 2D region of the application region by properly setting the processed data point as an unsampled data point in Equation 4 with a filter corresponding to the k-space dataset to which the 2D region belongs.

The filter application sub-module 443 may convolve the filter (or determine the application region) along the at least one trajectory one cell or a group of cells at a time. The stride of the filter movement may be a predetermined value (e.g., 1 cell, 2 cells, 3 cells, etc.) or a variable value. The filter application sub-module 443 may also determine the stride of the filter movement based on the size of the filter (e.g., 3×3×d, 4×4×d, 5×5×d, 3×4×d, etc., where d is the depth of the k-space datasets to be processed), the size of the k-space dataset, the adopted sampling technique, or the like, or a combination thereof. In some embodiments, the filter application sub-module 443 may set the stride as 1 cell as illustrated in FIG. 11-B.

Exemplary trajectories are illustrated in FIGS. 12 to 15. For example, the one or more trajectories for applying the filter may be a plurality of parallel lines with same directions (e.g., as illustrated in FIG. 12) or alternative directions (e.g., as illustrated in FIG. 14). The parallel lines may be along the $K_x$ direction or the $K_y$ direction. As another example, the one or more trajectories for applying the filter may be a spiral line starting from (or ending at) a region at or near the center of the k-space datasets (e.g., as illustrated in FIG. 11-B). The filter application sub-module 443 may use only one trajectory pattern to cover the predetermined region of the k-space datasets. Alternatively, the filter application sub-module 443 may use different trajectory patterns to cover different parts of the predetermined region of the k-space datasets (e.g., as illustrated in FIG. 15).

In some embodiments, the filter application sub-module 443 may pad zeroes to the plurality of k-space datasets when processing the data points at or near the edge or corner of the plurality of k-space datasets with the filter. Alternatively, the data points at or near the edge or corner of the plurality of k-space datasets may not be modified or replaced by the filter application sub-module 443 during 730.

The filter application sub-module 443 may perform 730 in one or more cycles. During each cycle, the filter application sub-module 443 may convolve the filter across the whole predetermined region of the input k-space datasets (the k-space datasets obtained in 710 for the first cycle, and output k-space datasets of a previous cycle for the further cycles) and generate a plurality of output k-space datasets (the output k-space datasets of the previous cycle is the aforementioned processed k-space datasets). In some embodiments, the filter application sub-module 443 may repeat the cycle for a certain number of times (e.g., 1, 10, 50, 100 times). Alternatively, the filter application sub-module 443 may perform the cycle iteratively until a certain criterion is met. In some embodiments, the criterion may be described by Equation 5, which may be expressed as:

$$\|X_{n+1}-X_n\|^2 \leq \in, \quad (5)$$

where $X_n$ refers to the input k-space datasets of the current cycle, $X_{n+1}$ refers to the output k-space datasets of the current cycle, c refers to a threshold.

The filter application sub-module 443 may obtain a plurality of k-space datasets (processed k-space datasets) as the output after the last cycle is performed. At least one of the processed k-space datasets may then be used to generate an MRI image or an MRS image of the subject scanned by the MRI scanner 110.

In 740, the image sub-module 444 may generate an MRI image or MRS image based on at least one of the processed k-space datasets. The image sub-module 444 may generate the MRI image or MRS image (e.g., using inverse Fourier transformation) based on any one of the processed k-space datasets. Alternatively, the image sub-module 444 may generate the MRI image or MRS image based on some processed k-space datasets or all of the processed k-space datasets.

An exemplary process for generating the MRI image based on multiple processed k-space datasets is illustrated in FIG. 16. The image sub-module 444 may first obtain the processed k-space datasets (e.g., k-space datasets 1611 to 1614 as illustrated in FIG. 16) to be used for generating the MRI image. Then, the image sub-module 444 may generate an image for each of the obtained k-space datasets. Next, the generated images (e.g., images 1621 to 1624 as illustrated in FIG. 16) may be combined by the image sub-module 444 to form the MRI image of the subject (e.g., image 1630 as illustrated in FIG. 16). The image sub-module 444 may use one or more techniques (e.g., PPA based techniques) well known in the art to perform the image combination.

It should be noted that the above descriptions of the processing the k-space datasets are only for demonstration purposes, and not intended to limit the scope of the present disclosure. It is understandable that, after learning the major concept and the mechanism of the present disclosure, a person of ordinary skill in the art may alter process 700 in an uncreative manner. For example, the operations above may be implemented in an order different from that illustrated in FIG. 7. One or more optional operations may be added to the flowcharts. One or more operations may be divided or be combined. All such modifications are within the protection scope of the present disclosure.

FIG. 8 is a schematic diagram illustrating an exemplary filter for processing a plurality of k-space datasets according to some embodiments of the present disclosure. The filter 810 may be a 3D matrix including a plurality of weighting factors (e.g., $w_{11}$ to $w_{49}$). The size of the filter 810 may be represented as width×height×depth.

The filter 810 may be generated using various techniques. For example, the filter 810 may be generated by the filter sub-module 442 based on data points within the fully-sampled calibration region 850 extending through k-space datasets 821 to 824 (e.g., with Equation 1 or 2). The calibration region 850 may be a part of (e.g., a central region) or the whole k-space datasets 821 to 824. As another example, the filter 810 may be generated based on data points within under-sampled regions of k-space datasets (e.g., as illustrated in FIG. 19). The filter 810 may be generated by the filter sub-module 552 based on data points of the k-space datasets to be processed. Alternatively, the filter 810 may be generated by the filter sub-module 552 based on k-space datasets (fully-sampled or under-sampled) relating to a previous scan.

The filter 810 may have an application region 830 extending through the k-space datasets 821 to 824. The filter 810 may interact with the data points within the application region 830 (e.g., for generating the filter, for processing the k-space datasets). For example, a plurality of linear functions may be obtained by applying the filter 810 to the application region 830. Detailed descriptions are provided in connection with FIG.

FIG. 9 is a schematic diagram illustrating an exemplary calibration region of a plurality of under-sampled k-space datasets according to some embodiments of the present disclosure. The under-sampled k-space datasets 900 may be obtained by the data acquisition module 430 using PPA based or other proper sampling techniques, such as SMASH, GRAPPA, etc. The MR signals or scan data may be sampled in a frequency less than the Nyquist frequency to generate the under-sampled k-space datasets 900. Each 2-D k-space dataset of the under-sampled k-space datasets 900 may be obtained using a coil of the MRI scanner 110.

The under-sampled k-space datasets 900 may include a fully-sampled calibration region 950 extending through the under-sampled k-space datasets 900. The data points within the calibration region 950 may be used by the full k-space dataset generation sub-module 441 to generate one or more kernels and/or linear equations for filling the under sampled k-space datasets 900 based on the corresponding sampling techniques. Some or all of the data points within the calibration region 950 may also be used by the filter sub-module 442 to generate the filter 810.

FIG. 10-A is a schematic diagram illustrating an exemplary calibration region for determining weighting factors of a filter according to some embodiments of the present disclosure. The calibration region 1010 may be fully-sampled and be included in fully-sampled k-space datasets or under-sampled k-space datasets. The filter sub-module 442 may determine a plurality of application regions (e.g., application regions 1020 and 1021) in the calibration region 1010. For each determined application region (e.g., the application region 1040), the filter sub-module 442 may obtain a plurality of linear functions based on the data points within the application region. The filter sub-module 442 may solve the obtained linear functions to determine the weighting factors of the filter.

FIG. 10-B is a schematic diagram illustrating an exemplary filter and an exemplary application region according to some embodiment of the present disclosure. The filter 1030 may be an embodiment of the filter 810 (illustrated in FIG. 8) including a plurality of weighting factors (e.g., $w_{11}$ to $w_{49}$). The weighting factors may be determined based on the data points within a fully-sampled calibration region of a first plurality of k-space datasets and be used to process a second plurality of k-space datasets. The first plurality of k-space datasets and the second plurality of k-space datasets may be the same or not. The application region 1040 may be a region of the k-space datasets interacting with (e.g., for generating the filter, for processing the k-space datasets) the filter during a corresponding operation. The application region 1040 may correspond to the filter 1030 and include a plurality of data points (or values, e.g., $k_{11}$ to $k_{49}$). By applying the filter 1030 to the application region 1040, the filter application sub-module 443 may obtain a plurality of relationships (e.g., linear functions) to determine weighing factors of the filter 1030 or to determine a new value for a data point (e.g., $k_{15}$) within the application region 1040.

FIGS. 11-A and 11-B are schematic diagram illustrating exemplary processes for applying a filter to the plurality of k-space datasets convolutionally according to some embodiments of the present disclosure. On a predetermined region 1100 (the region of the k-space datasets, e.g., the whole k-space datasets, a central region of the k-space datasets) of a plurality k-space datasets, the filter application sub-module 443 may determine a first application region 1110 and apply the filter (e.g., the filter 1030 illustrated in FIG. 10-B) to the application region 1110. By applying the filter to the application region 1110, the filter application sub-module 443 may process (e.g., modify or replace) a first data point (e.g., the data point 1111) within the application region 1110 (e.g., using Equation 3 or 4).

After the processed data point is modified or replaced, the filter application sub-module 443 may determine a second application region 1120 to determine a second data point (e.g., data point 1121). The second data point may have a same relative position (center, corner, etc.) or coordinate in the second application region as the relative position of the first data point in the first application region. If one or more prior determined data points (e.g., the first data point 1111) are included in the second application region, that prior determined data point may also be involved in the determining of the second data point (e.g., using Equation 3 or 4). By repeating the determination of the application region and the applying of the filter, the filter application sub-module 443 may convolve the filter across a first 2D region of the predetermined region 1100. Then the filter application sub-module 443 may convolve the filter across a second 2D region of the predetermined region 1100, and so on, until the whole predetermined region 1100 is processed.

Alternatively, after the first data point 1111 is processed, the filter application sub-module 443 may convolve the filter through the depth of the first application region 1110 to process the data points at a same position of the first application region 1110 but with different depths. One or more prior determined data points may also be involved in the determining of a next data point to be determined. After the filter being convolved through the depth of the first application region, the filter application sub-module 443 may determine the second application region 1120, convolve the filter through the depth of the second application region 1120, determine a third application region, and so on, until the whole predetermined region 1100 is processed.

The filter application sub-module 443 may determine application regions (e.g., the first application region 1110, the second application region 1120) and process data points along one or more trajectories (the arrow). The filter application sub-module 443 may set the one or more trajectories to cover the whole predetermined region 1100. The filter application sub-module 443 may move the filter (or determine the application region) along a trajectory one cell or a group of cells at a time. The stride of the filter movement may be a predetermined value (e.g., 1 cell, 2 cells, 3 cells, etc.) or a variable value. The filter application sub-module 443 may also determine the stride of the filter movement based on the size of the filter (e.g., 3×3×d, 4×4×d, 5×5×d, 3×4×d, etc., where d is the depth of the k-space datasets), the size of the k-space dataset, the adopted sampling technique, or the like, or a combination thereof. In some embodiments, the filter application sub-module 443 may set the stride as 1 cell as illustrated in FIG. 11-B.

FIGS. 12-A to 14-D are schematic diagrams illustrating exemplary sampling trajectories for acquiring MR signals to generate k-space datasets according to some embodiments of the present disclosure. For demonstration purposes, only sampling trajectories related to one coil (or one 2D k-space dataset) are illustrated in FIGS. 12-A to 14-D. Sampling trajectories related to other coils may have same or similar patterns. For simplicity; Cartesian grids are not shown in FIGS. 12-A to 14-D.

The data acquisition module 430 may sample MR signals along a sampling trajectory. The sampled MR signals may be digitally converted to provide sampled data points. The data acquisition module 430 may fill sampled data points into corresponding cells of a Cartesian grid to generate a k-space dataset. Alternatively or additionally, the data acquisition module 430 and/or the data processing module 440 may generate reconstructed data points based on the sampled data points (e.g., through interpolation, extrapolation, a PPA based technique, a CS based technique). The reconstructed data points may then be filled into the Cartesian grid.

FIGS. 12-A to 12-D illustrate exemplary sampling trajectories related to Cartesian sampling patterns. As shown in 12-A, the sampling trajectories may be a plurality of lines parallel with the $K_x$ direction. The sampling trajectories may be along the same direction (e.g., as illustrated in FIG. 12-B) or along alternative directions (e.g., as illustrated in FIG. 12-C).

To generate a fully-sampled k-space dataset, the distribution of the sampling trajectories may satisfy the Nyquist frequency (e.g., as illustrated in FIGS. 12-A to 12-C). The sampled data points may be directly filled into corresponding cells of a Cartesian grid to implement the fully-sampled k-space dataset.

To generate an under-sampled k-space dataset, one or more lines of the sampling trajectories for generating a fully-sampled k-spaces dataset may be omitted (e.g., the dotted lines illustrated in FIG. 12-D). The sampled data points may be directly filled into corresponding cells of a Cartesian grid to provide the under-sampled k-space dataset. The blank cells may be filled with reconstructed data points generated through, for example, a PPA based technique or a CS based technique. The omitted sampling trajectories may be distributed across the whole Cartesian coordinate system (evenly, partial-evenly, or randomly). Alternatively or additionally, the omitted sampling trajectories may be mainly set within one or more regions (e.g., a region away from the origin, a quadrant of the Cartesian coordinate system).

FIGS. 13-A to 13-F illustrate exemplary sampling trajectories related to radial sampling patterns. As shown in FIG. 13-A, the sampling trajectories may be a plurality of lines (or spokes) passing through or starting from (or ending at) the origin of the Cartesian coordinate system of the k-space dataset. The lines may be evenly distributed or un-evenly distributed. By adopting the radial sampling trajectories, the data points within the central region of the k-space dataset may be sampled for more times or be sampled with a higher density than the data points outside the central region.

The direction of the sampling trajectories may be various. For example, as illustrated in FIG. 13-B, all the sampling trajectories may start from the origin of the Cartesian coordinate system and point outward. As another example, as illustrated in FIGS. 13-C and 13-D, the sampling trajectories may pass through the origin of the Cartesian coordinate system and traverse the sampling region. The sampling may be performed along one sampling trajectory and then an adjacent one in a continuous pattern as illustrated in 13-C. Alternatively or additionally, the sampling may be performed along one sampling trajectory and then a sampling trajectory several trajectories away (or with an increased angel) also in an intermittent pattern, e.g., as illustrated in 13-D.

The data points may be sampled along the sampling trajectory. The sampled data points may be used to generate data points to be filled into the Cartesian grids through gridding operations. By controlling the density of the sampling trajectories (e.g., as illustrated in FIG. 13-F), the under-sampling degree of the generated k-space datasets may be determined. In some embodiments, the sampling trajectories within one or more quadrants of the Cartesian coordinate system may be omitted (e.g., as illustrated in FIG. 13-E).

FIGS. 14-A to 14-D illustrate exemplary sampling trajectories related to spiral sampling patterns. The sampling trajectories may be square spiral (as illustrated in FIG. 14-A), linear spiral (as illustrated in FIG. 14-B), non-linear spiral (as illustrated in FIG. 14-C), multi-shot spiral (e.g., as illustrated in FIG. 14-D). The spiral sampling trajectories may start from the origin of the Cartesian coordinate system and point outward.

For a square spiral sampling trajectory, the sampling trajectory may be formed by a plurality of sections parallel either with the phase encoding direction or with the frequency encoding direction, and a gridding operation is not needed to fill sampled data points into the Cartesian grids. The obtained k-space datasets may be fully-sampled or under-sampled based on the separation along the phase encoding direction or the frequency encoding direction between adjacent sections of the trajectories.

For linear spiral (or Archimedean spiral) sampling trajectories, the separation (e.g., along the radial direction) between a pair of adjacent sections of the trajectories may be constant. A gridding operation may be performed upon the sampled data points to generate data points to be filled into the Cartesian grids. The obtained k-space datasets may be fully-sampled or under-sampled based on the separation (e.g., along the radial direction) between adjacent sections of the trajectories.

For non-linear spiral sampling trajectories, the separation (e.g., along the radial direction) between a pair of adjacent sections of the trajectories may be increasing. For example, the non-linear spiral may be an exponential spiral. The data points within the central region of the k-space dataset may be sampled for more times or be sampled with a higher density than the data points outside the central region. The gridding operation may be performed upon the sampled data points to generate data points to be filled into the Cartesian grids. The obtained k-space datasets may be under-sampled.

For multi-shot spiral sampling trajectories, the sampling trajectories may include a plurality of leaves, each leaf is a linear spiral or a non-linear spiral. By increasing or decreasing the number of leaves, or the parameter of each spiral, the obtained k-space datasets may be fully-sampled or under-sampled.

It may be noted that, the aforementioned sampling trajectories are only for demonstration purposes and not intended to be limiting. For generating k-space datasets of different slices of a scan subject, the same or different sets of sampling trajectories may be adopted, for example, by the data acquisition module 430.

FIGS. 15-A to 15-C are schematic diagrams illustrating exemplary sampling patterns for acquiring MR signals based on compressed sensing technique according to some embodiments of the present disclosure. The compressed sensing technique (CS) may allow data points to be sampled with a frequency far below the Nyquist frequency, so as to improve the scan speed.

A sampling pattern relating to the CS technique may be random. An exemplary 2D k-space dataset 1500 obtained through the CS technique is illustrated in FIG. 15-A. The k-space dataset 1500 may include a fully-sampled region 1510, which may be a central region of the k-space dataset 1500. The surrounding region may be sparsely sampled and the cells filled with sampled data points may be randomly distributed based on the sampling pattern adopted or calculated.

In some embodiments, the random sampling pattern related to the CS technique may include random sampling trajectories (e.g., as illustrated in FIG. 15-B). The sampling pattern may be such that the central region of the Cartesian grid is fully sampled, while the surrounding region is randomly sampled. The random sampling trajectories may be generated in real-time or be pre-determined (e.g., retrieved from a storage device).

In some embodiments, the random sampling pattern related to the CS technique may be based on a Cartesian sampling pattern, a radial sampling pattern, or a spiral sampling pattern, etc. The CS sampling pattern may be obtained by introducing one or more random factors into the aforementioned sampling patterns. According to an exemplary Cartesian pattern based random sampling pattern (e.g., as illustrated in FIG. 15-C), data points along each trajectory may be fully-sampled (or be randomly sampled in some embodiments). The distribution of the trajectories along the phase encoding direction may be set sparsely and/or randomly. The trajectories in the vicinity of the Kx axis may be set to satisfy the Nyquist frequency so that data points within the central region are fully-sampled. According to an exemplary radial pattern based random sampling pattern (not shown), the spokes may be arranged randomly and/or sparsely. According to an exemplary spiral pattern based random sampling pattern (not shown), a random factor may be added into the function (or look-up table) defining the spiral, so that a resulting spiral sampling trajectory may be distorted. In some embodiments, a random factor may also be added into the function (or look-up table) defining a radial pattern or Cartesian pattern to generate a distorted sampling pattern for the random sampling.

For generating k-space datasets of different slices of a scan subject, the same or different sets of random sampling patterns may be adopted to implement the CS based sampling technique. Based on the random sampling adopted, the sampled data points may be directly filled into a k-space dataset, or a gridding operation may be involved. After a plurality of sparse k-space datasets (under-sampled) such as the k-space dataset 1500 are obtained, the data acquisition module 430 may apply a compressed sensing reconstruction technique on the under-sampled k-space datasets. For example, the data acquisition module 430 may generate data points using a non-linear reconstruction scheme such as an $l^1$-minimization. The generated data points may be filled into the under-sampled k-space datasets, which may then be processed by the data processing module 440 to generate an MRI image or an MRS image.

FIG. 16 is a schematic diagram illustrating an exemplary process for generating an MRI image based on multiple processed k-space datasets according to some embodiments of the present disclosure. The k-space datasets 1611 to 1614 may be obtained by the image sub-module 444 after processing a plurality of k-space datasets using the filter F. The image sub-module 444 may generate an image for each of the k-space datasets and obtain the images 1611 to 1614. The image sub-module 444 may then combine the images 1611 to 1614 to form the MRI image 1630 of the subject. The image sub-module 444 may use one or more techniques well known in the art (e.g., the image combination technique adopted in SENSE or a variant of SENSE) to perform the image combination.

In some embodiments, 710 of process 700 may be performed based on an exemplary process illustrated in FIG. 17. FIG. 17 is a schematic diagram illustrating an exemplary process for generating k-space datasets according to some embodiments of the present disclosure.

The data acquisition module 430 may sample MR signals or scan data with a weighting function E using the MRI scanner 110 and obtain a plurality of k-space datasets 1720. The MRI scanner 110 may include a plurality of coils. The plurality of coils may receive MR signals related to a scan of a subject (e.g., the subject 550). The data acquisition module 430 may then generate a k-space dataset based on the MR signals received by each of the plurality of coils to obtain the k-space datasets 1720.

The weighting function E may be used by the data acquisition module 430 to perform a density weighted sampling or acquisition weighted sampling. The weighting function E may cause the data points closer to the center of each of the k-space datasets 1720 being sampled for more times. A graphic demonstration of an exemplary weighting function F on a Cartesian grid is illustrated by image 1710, which is provided for demonstration purposes and not intended to be limiting. The weighting function E may be a continuous function and a combination of a cosine function and one or more other functions. The greyscales of the cells of the Cartesian grid illustrated in the image 1710 may represent the average sampled times of the corresponding MR signals or scan data. After the data acquisition using the weighting function E, a data point may be determined based on the data points acquired in multiple samplings and be filled into a corresponding cell. For example, the data point may be a mean (weighted or not weighted) of the data points acquired in one or more of the multiple samplings.

The weighting function E may be expressed in the form of one or more look-up tables. Such look-up tables may be pre-stored in a storage device (e.g., the storage device 150, the storage 220, the memory 360, the storage 390, an external storage accessible by the imaging system 100 via, e.g., the network 120). Using the weighting function E, the data acquisition module 430 may guide the coils of the MRI scanner 110 to generate RF pulses and gradient pulses through the scanner control module 420, and determine the cells of the Cartesian grid to be filled with the sampled scan data.

In some embodiments, with the weighting function E, the k-space datasets 1720 obtained by the data acquisition module 430 may be fully-sampled k-space datasets. The k-space datasets 1720 may then be processed by the filter application sub-module 443 in 730 of process 700 with one or more filters. The one or more filters may be generated by the filter sub-module 442 based on data points of a central region (fully-sampled) extending through the k-space datasets 1720 according to related description in 720 of the process 700. For example, the filter sub-module 442 may generate a plurality of filters based on data points of the central region, where one of the plurality of filters may corresponds to one of the plurality of k-space datasets; the filter application sub-module 443 may then apply each of the plurality of filters to a corresponding k-space dataset of the plurality of k-space datasets in 730.

In some embodiments as shown in FIG. 17, with the weighting function E, the data acquisition module 430 may sample the MR signals or scan data in a manner that the k-space datasets 1720 may include a fully-sampled region 1721 and an under-sampled region 1722. The fully-sampled region 1721 may be a central region extending through the k-space datasets 1720, and the under-sampled region 1722 may be a surrounding region extending through the k-space datasets 1720. In some embodiments, the under-sampled region 1722 may only include blank cells. Alternatively, the under-sampled region 1722 may include a plurality of sampled data points and a plurality of unsampled data points (blank cells).

In some embodiments, the data acquisition module 430 may sample the MR signals in an elliptical central view order using the weighting function E. The fully-sampled region 1721 may be an elliptical region.

In some embodiments, the full k-space dataset generation sub-module 441 may first fill the blank cells of the under-sampled region 1722 to obtain a plurality of full k-space datasets 1730. In some embodiments, the full k-space dataset generation sub-module 441 may fill the blank cells by way of interpolation or extrapolation. Alternatively, the full k-space dataset generation sub-module 441 may fill the blank cells using corresponding data points relating to a second scanning of the same scan region of the scan subject. The k-space datasets 1730 may then be processed by the data processing module 440 through 730 and 740 of process 700 to generate an MRI image or MRS image of the scan subject.

In some embodiments, the obtained under-sampled k-space datasets 1720 may be firstly processed by the data processing module 440 using one or more filters determined in 720 of process 700. For example, a plurality of filters may be generated by the filter sub-module 442 based on data points of the fully-sampled region 1721. One of the plurality of filters may correspond to one of the plurality of the k-space datasets 1720. The filter application sub-module 443 may then apply the plurality of filters to the fully-sampled region 1721 (serving as the aforementioned predetermined region) of the k-space datasets 1720 convolutionally, and obtain a processed fully-sampled region. The filter application sub-module 443 may apply each of the plurality of filters to a corresponding k-space dataset (or a corresponding 2D region of the fully-sampled region 1721) of the plurality of k-space datasets in 730. The full k-space dataset generation sub-module 441 may then reconstruct the unsampled data points of the under-sampled region 1722 based on data points of the processed fully sampled region (e.g., using a PPA based technique, extrapolation, interpolation) to fill the under-sampled region 1722 and obtain a filled region extending through the k-space datasets 1720. Optionally, the filter application sub-module may further apply the plurality of filters to the filled region, during which at least some of sampled data points of the filled region are modified with the plurality of filter.

In some embodiments, 710 of process 700 may be performed based on an exemplary process illustrated in FIG. 18. FIG. 18 is a schematic diagram illustrating an exemplary process for generating the k-space datasets according to some embodiments of the present disclosure. The process illustrated in FIG. 18 is an embodiment of the process illustrated in FIG. 17 with a faster data acquisition speed. Some related descriptions of FIG. 17 may also be incorporated into descriptions of FIG. 18

In FIG. 18, the data acquisition module 430 may sample MR signals or scan data using both weighting function E and a PPA based technique (e.g., SMASH, GRAPPA). The combination of the weighting function E and the PPA based technique may also be implemented by a look-up table. The sampled data may be filled in the cells within an elliptical region 1811 extending through the under-sampled k-space datasets 1810, while the cells of the remaining region may be left blank. In addition, the data acquisition module 430 may sample the MR signals or scan data with a frequency lower than the Nyquist frequency, and there may also be blank cells within the elliptical region 1811. A calibration region 1813 at or near the center of the k-space datasets 1810 may be fully-sampled for reconstructing data point based on sampled data points using the PPA based technique.

The full k-space dataset generation sub-module 441 may first fill some blank cells outside the elliptical region 1811 using data points reconstructed by way of, e.g., interpolation or extrapolation based on the sampled data points and obtain a plurality of reduced k-space datasets 1820. The reduced k-space datasets 1820 may have a filling pattern similar to under-sampled k-space datasets obtained using only the PPA based technique. Then the full k-space dataset generation sub-module 441 may fill the blank cells of the reduced k-space datasets 1820 with data point reconstructed using the PPA based technique based on the known data points (sampled or reconstructed) of the reduced k-space datasets 1820 and obtain a plurality of full k-space datasets 1830.

The k-space datasets 1830 may then be processed by the data processing module 440 to generate an MRI image or MRS image of the scan subject. Data points within the calibration region 1813 or another determined calibration region may be used to determine the weights of the filter.

Alternatively, the full k-space dataset generation sub-module 441 may first fill the elliptical region 1811 using a PPA based technique based on the data points of the calibration region 1813 to obtain a filled region, and then fill the region outside the elliptical region 1811 using, for example, interpolation or extrapolation based on the data points of the filled region to generate the full k-space datasets 1830.

In some embodiments, after the filling of the elliptical region 1811, a self-consistent filtering may be first performed by the data processing module 440 on the filled region to obtain a processed region. Then the region outside the elliptical region 1811 may be filled by the full k-space dataset generation sub-module 441 using, for example, interpolation or extrapolation based on the data points of the processed region. Optionally, the region outside the elliptical region 1811 may then be processed using the self-consistent filtering by the data processing module 440.

In some embodiments, 710 of process 700 may be performed based on an exemplary process illustrated in FIG. 19. FIG. 19 is a schematic diagram illustrating an exemplary process for generating the k-space datasets according to some embodiments of the present disclosure.

The data acquisition module 430 may sample the MR signals or scan data using a PPA based technique, a CS based technique, or other techniques for obtaining under-sampled k-space datasets 1910. From data points within a fully-sampled calibration region 1911 extending through the under-sampled k-space datasets 1910, the filter sub-module 442 may generate a filter 1915 according to, for example, the description of 720 of process 700 illustrated in FIG. 7 (e.g., based on Equation 1). The filter 1915 is an embodiment of the filter 1030.

The full k-space dataset generation sub-module 441 may determine a plurality of application regions on the under-sampled k-space datasets 1910 to cover all the unsampled data points and applying the filter 1915 to the determined application regions. The plurality of application regions may include both sampled data points and unsampled data points. A plurality of linear functions (e.g., in the form of Equation 3) may be obtained by applying the filter to the determined application regions. By solving the plurality of linear functions, the unsampled data points may be determined and the blank cells of the under-sampled k-space datasets 1910 may be filled with the reconstructed data points. The full k-space dataset generation sub-module 441 may obtain k-space datasets 1920. During this process, the sampled data points of the under-sampled k-space datasets 1910 are not modified or replaced.

The k-space datasets 1920 may then be processed by the filter application sub-module 443 with the already obtained filter 1915 to generate the processed k-space datasets according to the description of 730. During this process, the sampled data points as well as the reconstructed data points of the k-space datasets 1920 may be modified or replaced. The processed k-space datasets may then be used to generate an MRI image or an MRS image.

In some embodiments, the fully-sampled calibration region 1911 may not be included in the under-sampled k-space datasets 1910, or the weighting factors may not be uniquely determined based on the data points within the calibration region 1911. The filter sub-module 442 (or the full k-space dataset generation sub-module 441) may determine a plurality of application region including sampled data points and unsampled data points within the plurality of under-sampled k-space datasets. By applying the filter 1915 to the determined application region, the filter sub-module 442 (or the full k-space dataset generation sub-module 441) may obtain a plurality of linear functions. By solving the linear functions iteratively with one or more constrained optimization formulations or criterions, the filter sub-module 442 (or the full k-space dataset generation sub-module 441) may determine the weighting factors of the filter 1915 as well as the unsampled data points of the under-sampled k-space datasets 1910 to obtain the k-space datasets 1920. The k-space datasets 1920 may then be processed by the filter application sub-module 443 with the filter 1915 to generate the processed k-space datasets according to the description of 730.

In some embodiments, the constrained optimization formulations or criterions may include Equation 6, which may be expressed as:

$$\text{minimize} \|FX-X\|^2, \quad (6)$$

where F refers to the filter 1915, X refers to the k-space datasets obtained in a previous iterate cycle, and FX refers to the k-space datasets generated in one iterate cycle by using the filter to construct or recalculate the unsampled data points of the under-sampled k-space datasets 1910. The weighing factors of F may also be updatable during the iteration.

FIG. 20 is a schematic diagram illustrating an exemplary process for processing the k-space datasets according to some embodiments of the present disclosure. Process 2000 may be an example of process 700 illustrated in FIG. 7. One or more operations of process 2000 may be performed by the data processing module 430 for processing the k-space datasets (fully-sampled or under-sampled) obtained by the data acquisition module 430. In some embodiments, one or more operations of process 2000 illustrated in FIG. 20 for processing the k-space datasets may be implemented in the imaging system 100 illustrated in FIG. 1. For example, the process 2000 illustrated in FIG. 7 may be stored in the storage device 150 in the form of instructions, and invoked and/or executed by the processing device 140 (e.g., the processor 210 of the computing device 200 as illustrated in FIG. 2).

In 2010, the processing device 140 may cause the MRI scanner 110 to acquire MR data related to a subject (e.g., the subject 550 illustrated in FIG. 5). The operation may be the same as or similar to the one illustrated in FIG. 5. Description of operation 2010 may be found elsewhere in the present disclosure (e.g., FIGS. 5, 7 and descriptions thereof).

In 2020, the data acquisition module 430 may enter the MR data into a plurality of k-space datasets by sampling the MR data using an acquisition weighting technique or a density weighting technique. The plurality of k-space datasets may be fully-sampled or under-sampled. Each of the plurality of k-space datasets may include at least one sampled region fulfilled with sampled k-space lines (e.g., calibration region 1010 illustrated in FIG. 10-A). A sampled k-space line may be a line of sample data points that may be obtained using a linear sampling trajectory (e.g., as illustrated in FIGS. 12-A, 13-A, and 14-A).

The acquisition weighting technique or the density weighting technique may be implemented by a weighting function E. The weighting function E may cause the data points closer to the center of each of the k-space datasets being sampled for more times. The weighting function E may be in the form of a continuous function (e.g., a combination of a cosine function and one or more other functions) or a look-up table.

In some embodiments, the each of the plurality of k-space datasets (e.g., under-sampled k-space datasets) may include at least one under-sampled region with unsampled k-space lines. An unsampled k-space line may be a line of unsampled data points (e.g., the dotted lines illustrated in FIGS. 12-D, 13-E, 13-F, and 15-C). The unsampled k-space line may be left unsampled in order to increase the scan speed of the MRI scanner 110.

In some embodiments, the at least one sampled region is in the center of the each of the plurality of k-space datasets, and the at least one under-sampled region is in a corner of each of the plurality of k-space dataset (e.g., the k-space datasets 1720 illustrated in FIG. 17).

In some embodiments, the MR data is sampled further using a compressed sensing (CS) based technique (e.g., FIGS. 15-A and 15-B and the descriptions thereof). The CS based technique may adopt a random sampling pattern and the MR data may be sampled with a frequency far below the Nyquist frequency. Consequently, the obtained k-space datasets may be relatively sparse. To implement the CS based technique, for example, a random factor may be introduced into the weighting function E.

Operations 2010 and 2020 may be performed to achieve operation 710 of process 700 illustrated in FIG. 7.

In 2030, for each of the plurality of k-space datasets, the filter sub-module 442 may obtain a convolution filter (e.g., the filter 1030 illustrated in FIG. 10-B) based on the at least one sampled region, and the filter application sub-module 443 may produce a modified k-space dataset by applying the convolution filter to the k-space dataset. Operation 2030 may be performed to achieve operations 720 and 730 of process 700 illustrated in FIG. 7.

In some embodiments, during the application of the convolution filter to the each of the plurality of k-space dataset, the filter application sub-module 443 may modify the k-space lines of the sampled region via the convolution filter (e.g., in a manner as illustrated in FIGS. 11-A and 11-B) to generate modified k-space lines. The filter application sub-module 443 may also estimate k-space line data (unsampled data points) for the unsampled k-space lines based on the modified k-space line. For example, the filter application sub-module 443 may first modify the data points within the sampled region to generated modified k-space line formed by modified data points, and then apply the convolution filter on an application region including a plurality of modified data points and one or more unsampled data points. By solving the linear equations obtained via the application of the convolutional filter, data points may be reconstructed and filled into corresponding cells of the corresponding Cartesian grid.

In some embodiments, after the filling of the reconstructed data points, the unsampled k-space lines may be modified based on the modified k-space lines.

In operation 2040, the image sub-module 444 may generate an image of the subject using the modified k-space datasets. Operation 2040 may be the same as or similar to the operation 740, the descriptions of which are not repeated here.

It should be noted that the above descriptions of the processing the k-space datasets are only for demonstration purposes, and not intended to limit the scope of the present disclosure. It is understandable that, after learning the major concept and the mechanism of the present disclosure, a person of ordinary skill in the art may alter process 2000 in an uncreative manner. For example, the operations above may be implemented in an order different from that illustrated in FIG. 20. One or more optional operations may be added to the flowcharts. One or more operations may be divided or be combined. All such modifications are within the protection scope of the present disclosure.

Having thus described the basic concepts, it may be rather apparent to those skilled in the art after reading this detailed disclosure that the foregoing detailed disclosure is intended to be presented by way of example only and is not limiting. Various alterations, improvements, and modifications may occur and are intended to those skilled in the art, though not expressly stated herein. These alterations, improvements, and modifications are intended to be suggested by this disclosure, and are within the spirit and scope of the exemplary embodiments of this disclosure.

Moreover, certain terminology has been used to describe embodiments of the present disclosure. For example, the terms "one embodiment," "an embodiment," and/or "some embodiments" mean that a particular feature, structure or characteristic described in connection with the embodiment is included in at least one embodiment of the present disclosure. Therefore, it is emphasized and should be appreciated that two or more references to "an embodiment" or "one embodiment" or "an alternative embodiment" in various portions of this specification are not necessarily all referring to the same embodiment. Furthermore, the particular features, structures or characteristics may be combined as suitable in one or more embodiments of the present disclosure.

Further, it will be appreciated by one skilled in the art, aspects of the present disclosure may be illustrated and described herein in any of a number of patentable classes or context including any new and useful process, machine, manufacture, or composition of matter, or any new and useful improvement thereof. Accordingly, aspects of the present disclosure may be implemented entirely hardware, entirely software (including firmware, resident software, micro-code, etc.) or combining software and hardware implementation that may all generally be referred to herein as a "unit," "module," or "system." Furthermore, aspects of the present disclosure may take the form of a computer program product embodied in one or more computer readable media having computer readable program code embodied thereon.

A computer readable signal medium may include a propagated data signal with computer readable program code embodied therein, for example, in baseband or as part of a carrier wave. Such a propagated signal may take any of a variety of forms, including electro-magnetic, optical, or the like, or any suitable combination thereof. A computer readable signal medium may be any computer readable medium that is not a computer readable storage medium and that may communicate, propagate, or transport a program for use by or in connection with an instruction execution system, apparatus, or device. Program code embodied on a computer readable signal medium may be transmitted using any appropriate medium, including wireless, wireline, optical fiber cable, RF, or the like, or any suitable combination of the foregoing.

Computer program code for carrying out operations for aspects of the present disclosure may be written in any combination of one or more programming languages, including an object oriented programming language such as Java, Scala, Smalltalk, Eiffel, JADE, Emerald, C++, C #, VB. NET, Python or the like, conventional procedural programming languages, such as the "C" programming language, Visual Basic, Fortran 2103, Perl, COBOL 2102, PHP, ABAP, dynamic programming languages such as Python, Ruby, and Groovy, or other programming languages. The program code may execute entirely on the user's computer, partly on the user's computer, as a stand-alone software package, partly on the user's computer and partly on a remote computer or entirely on the remote computer or server. In the latter scenario, the remote computer may be connected to the user's computer through any type of network, including a local area network (LAN) or a wide area network (WAN), or the connection may be made to an external computer (for example, through the Internet using an Internet Service Provider) or in a cloud computing environment or offered as a service such as a Software as a Service (SaaS).

Furthermore, the recited order of processing elements or sequences, or the use of numbers, letters, or other designations therefore, is not intended to limit the claimed processes and methods to any order except as may be specified in the claims. Although the above disclosure discusses through various examples what is currently considered to be a variety of useful embodiments of the disclosure, it is to be understood that such detail is solely for that purposes, and that the appended claims are not limited to the disclosed embodiments, but, on the contrary, are intended to cover modifications and equivalent arrangements that are within the spirit and scope of the disclosed embodiments. For example, although the implementation of various components described above may be embodied in a hardware device, it may also be implemented as a software only solution, for example, an installation on an existing server or mobile device.

Similarly, it should be appreciated that in the foregoing description of embodiments of the present disclosure, various features are sometimes grouped together in a single embodiment, figure, or description thereof for the purposes of streamlining the disclosure aiding in the understanding of one or more of the various inventive embodiments. This method of disclosure, however, is not to be interpreted as reflecting an intention that the claimed subject matter requires more features than are expressly recited in each claim. Rather, inventive embodiments lie in less than all features of a single foregoing disclosed embodiment.

In some embodiments, the numbers expressing quantities or properties used to describe and claim certain embodiments of the application are to be understood as being modified in some instances by the term "about," "approximate," or "substantially." For example, "about," "approximate," or "substantially" may indicate ±20% variation of the value it describes, unless otherwise stated. Accordingly, in some embodiments, the numerical parameters set forth in the written description and attached claims are approximations that may vary depending upon the desired properties sought to be obtained by a particular embodiment. In some embodiments, the numerical parameters should be construed in light of the number of reported significant digits and by applying ordinary rounding techniques. Notwithstanding that the numerical ranges and parameters setting forth the broad scope of some embodiments of the application are approximations, the numerical values set forth in the specific examples are reported as precisely as practicable.

Each of the patents, patent applications, publications of patent applications, and other material, such as articles, books, specifications, publications, documents, things, and/or the like, referenced herein is hereby incorporated herein by this reference in its entirety for all purposes, excepting any prosecution file history associated with same, any of same that is inconsistent with or in conflict with the present document, or any of same that may have a limiting affect as to the broadest scope of the claims now or later associated with the present document. By way of example, should there be any inconsistency or conflict between the description, definition, and/or the use of a term associated with any of the incorporated material and that associated with the present document, the description, definition, and/or the use of the term in the present document shall prevail.

In closing, it is to be understood that the embodiments of the application disclosed herein are illustrative of the principles of the embodiments of the application. Other modifications that may be employed may be within the scope of the application. Thus, by way of example, but not of limitation, alternative configurations of the embodiments of the application may be utilized in accordance with the teachings herein. Accordingly, embodiments of the present application are not limited to that precisely as shown and describe.

What is claimed is:

1. A method, implemented on at least one device each of which has at least one processor and storage, the method comprising:
    obtaining, by the at least one processor, a plurality of k-space datasets related to a scanning of a subject performed by an MRI scanner, each of the plurality of k-space datasets including a plurality of data points, the plurality of data points including data points sampled by the MRI scanner, wherein the plurality of k-space datasets includes under-sampled k-space datasets obtained using a sampling pattern relative to a compressed sensing based technique;
    obtaining, by the at least one processor, at least one filter for processing the plurality of k-space datasets, the filter including a plurality of weighting factors;
    applying, by the at least one processor, the at least one filter to the plurality of k-space datasets convolutionally to obtain a plurality of processed k-space datasets, wherein by applying the at least one filter, an application region extending through the plurality of k-space datasets is determined within the plurality of k-space datasets, and a data point within the application region is modified based at least on the other data points within the application region and the plurality of weighting factors; and
    generating, by the at least one processor, an image based on at least one of the processed k-space datasets, wherein
    during the convolutional application of the at least one filter to the plurality of k-space datasets, at least some of the data points sampled by the MRI scanner are modified with the at least one filter.

2. The method of claim 1, the MRI scanner including a plurality of coils, the obtaining the plurality of k-space datasets comprising:
    receiving, by the plurality of coils, MR signals related to the scanning of the subject;
    obtaining, by the at least one processor, a fully-sampled k-space dataset from MR signals received by each of the plurality of coils; and
    designating the obtained fully-sampled k-space datasets as the plurality of k-space datasets.

3. The method of claim 1, the MRI scanner including a plurality of coils, the obtaining the plurality of k-space datasets comprising:
    receiving, by the plurality of coils, MR signals related to a first scanning of the subject;
    obtaining, by the at least one processor, a first k-space dataset from MR signals received by each of the plurality of coils;
    receiving, by the plurality of coils, MR signals related to a second scanning of the subject;
    obtaining, by the at least one processor, a second k-space dataset from MR signals received by each of the plurality of coils, wherein the obtained second k-space datasets are under-sampled datasets; and
    generating, by the at least one processor, the plurality of k-space datasets based on at least some of the data points of the first k-space datasets and at least some of the data points of the second k-space datasets.

4. The method of claim 1, the MRI scanner including a plurality of coils, the obtaining the plurality of k-space datasets comprising:
    receiving, by the plurality of coils, MR signals related to the scanning of the subject;
    obtaining, by the at least one processor, the under-sampled k-space dataset from the MR signals received by each of the plurality of coils, each under-sampled k-space dataset including at least one sampled data point and at least one unsampled data point; and
    generating, by the at least one processor, the plurality of k-space datasets by filling the under-sampled k-space datasets with the unsampled data points reconstructed based on the sampled data points of the obtained under-sampled k-space datasets.

5. The method of claim 4,
    further comprising:
    generating, by the at least one processor, the plurality of k-space datasets by applying a compressed sensing reconstruction technique on the under-sampled k-space datasets.

6. The method of claim 1, the obtaining the at least one filter including:
    determining a fully-sampled calibration region within the plurality of k-space datasets, the calibration region extending through the plurality of k-space datasets; and
    determining the plurality of weighting factors based on the data points within the calibration region.

7. The method of claim 1, the MRI scanner including a plurality of coils, the obtaining the plurality of k-space datasets comprising:
    receiving, by the plurality of coils, MR signals related to the scanning of the subject, wherein the scanning is performed using a weighting function causing the data points closer to a center of a k-space dataset being sampled for more times; and
    generating a k-space dataset based on the MR signals received by each of the plurality of coils to obtain the plurality of k-space datasets.

8. The method of claim 7, the plurality of k-space datasets including a fully-sampled region extending through the plurality of k-space datasets, the obtaining the at least one filter comprising:
    generating a plurality of filters based on data points of the fully-sampled region, wherein one of the plurality of filters corresponds to one of the plurality of k-space datasets; and
    the applying the at least one filter to the plurality of k-space datasets convolutionally comprising:
    applying each of the plurality of filters to a corresponding k-space dataset of the plurality of k-space datasets.

9. The method of claim 8, the plurality of k-space datasets further including an under-sampled region extending through the plurality of k-space datasets, the under-sampled region including unsampled data points, wherein the fully-sampled region is a central region of the plurality of k-space dataset, the under-sampled region is a surrounding region, and the applying the at least one filter to the plurality of k-space datasets convolutionally including: applying the plurality of filters to the fully-sampled region of the k-space datasets convolutionally to obtain a processed fully-sampled region; and reconstructing the unsampled data points of the under-sampled region based on data points of the processed fully-sampled region to obtain a filled region.

10. The method of claim 9, further comprising:

applying the plurality of filters to the filled region, during which at least some of sampled data points of the filled region are modified with the plurality of filter.

11. The method of claim 1, the image is a magnetic resonance spectrum image or a magnetic resonance spectroscopic image.

12. The method of claim 1, wherein the data point within the application region is determined based on all the data points within the application region and the plurality of weighting factors.

13. The method of claim 1, the applying the filter to the plurality of k-space datasets convolutionally comprising:

determining a region extending through the k-space datasets for applying the filter;

determining at least one trajectory throughout the region;

determining a first application region along the at least one trajectory:

processing a first data point within the first application region by applying the filter to the first application region:

determining a second application region along the at least one trajectory, wherein the first data point is included in the second application region; and processing a second data point within the first application region by applying the filter to the second application region, wherein the second data point is processed based on the processed first data point.

14. A method for magnetic resonance imaging (MRI), comprising:

causing an MRI scanner to acquire MR data related to a subject, wherein the MR data is sampled using a compressed sensing based technique;

entering the MR data into a plurality of k-space datasets by sampling the MR data using an acquisition weighting technique or a density weighting technique, each of the plurality of k-space datasets including at least one fully-sampled region filled with sampled k-space lines;

for each of the plurality of k-space datasets, obtaining a convolution filter based on the at least one fully-sampled region, and producing a modified k-space dataset by applying the convolution filter to the k-space dataset; and reconstructing an image of the subject using the modified k-space datasets.

15. The method of claim 14, wherein the each of the plurality of k-space datasets includes at least one under-sampled region with unsampled K-space lines.

16. The method of claim 15, wherein the at least one fully-sampled region is in a center of the each of the plurality of k-space datasets, and the at least one under-sampled region is in a corner of each of the plurality of k-space dataset.

17. The method of claim 15, the producing the modified k-space dataset by applying the convolution filter to the k-space dataset comprising:

modifying the k-space lines of the fully-sampled region by applying the convolution filter to generate modified k-space lines; and estimating k-space line data for the un-sampled k-space lines based on the modified k-space lines.

18. The method of claim 17, further comprising:

modifying the un-sampled k-space lines based on the modified k-space lines.

19. A system, comprising at least one processor and at least one storage for storing instructions, the instructions, when executed by the at least one processor, causing the system to:

obtain a plurality of k-space datasets related to a scanning of a subject performed by an MRI scanner, each of the plurality of k-space datasets including a plurality of data points, the plurality of data points including data points sampled by the MRI scanner, wherein the plurality of k-space datasets includes under-sampled k-space datasets obtained using a sampling pattern relative to a compressed sensing based technique;

obtain at least one filter for processing the plurality of k-space datasets, the filter including a plurality of weighting factors;

apply the at least one filter to the plurality of k-space datasets convolutionally to obtain a plurality of processed k-space datasets; wherein by applying the at least one filter, an application region extending through the plurality of k-space datasets is determined within the plurality of k-space datasets, and a data point within the application region is modified based at least on the other data points within the application region and the plurality of weighting factors; and generate an image based on at least one of the processed k-space datasets, wherein during the convolutional application of the at least one filter to the plurality of k-space datasets, at least some of the data points sampled by the MRI scanner are modified with the at least one filter.

* * * * *